US011235969B2

(12) United States Patent
Cheng et al.

(10) Patent No.: US 11,235,969 B2
(45) Date of Patent: Feb. 1, 2022

(54) CMOS-MEMS INTEGRATION WITH THROUGH-CHIP VIA PROCESS

(71) Applicant: Taiwan Semiconductor Manufacturing Co., Ltd., Hsin-Chu (TW)

(72) Inventors: Chun-Wen Cheng, Zhubei (TW); Chia-Hua Chu, Zhubei (TW); Wen Cheng Kuo, Changhua County (TW); Wei-Jhih Mao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 355 days.

(21) Appl. No.: 16/420,514

(22) Filed: May 23, 2019

(65) Prior Publication Data
US 2020/0131028 A1    Apr. 30, 2020

Related U.S. Application Data

(60) Provisional application No. 62/752,545, filed on Oct. 30, 2018.

(51) Int. Cl.
*B81B 7/00* (2006.01)
*B81C 1/00* (2006.01)
*B81C 3/00* (2006.01)

(52) U.S. Cl.
CPC .............. *B81B 7/008* (2013.01); *B81B 7/007* (2013.01); *B81C 1/0023* (2013.01); *B81C 1/00238* (2013.01); *B81C 1/00246* (2013.01); *B81C 1/00269* (2013.01); *B81C 1/00301* (2013.01);

(Continued)

(58) Field of Classification Search
CPC ............ B81B 7/007; B81B 2203/0315; B81C 1/00238; B81C 1/00246; B81C 1/00269; B81C 1/00301; B81C 3/001
See application file for complete search history.

(56) References Cited

U.S. PATENT DOCUMENTS 9,315,378 B2    4/2016  Cheng et al.
2014/0030847 A1*  1/2014  Kotlanka ............... H01L 21/50
                                                    438/107

(Continued)

FOREIGN PATENT DOCUMENTS

CN        103523745 A       1/2014

*Primary Examiner* — Marcos D. Pizarro
(74) *Attorney, Agent, or Firm* — Eschweiler & Potashnik, LLC

(57) ABSTRACT

The integrated CMOS-MEMS device includes a CMOS structure, a cap structure, and a MEMS structure. The CMOS structure, fabricated on a first substrate, includes at least one conducting layer. The cap structure, including vias passing through the cap structure, has an isolation layer deposited on its first side and has a conductive routing layer deposited on its second side. The MEMS structure is deposited between the first substrate and the cap structure. The integrated CMOS-MEMS device also includes a conductive connector that passes through one of the vias and through an opening in the isolation layer on the cap structure. The conductive connector conductively connects a conductive path in the conductive routing layer on the cap structure with the at least one conducting layer of the CMOS structure.

20 Claims, 42 Drawing Sheets

(52) U.S. Cl.
CPC ...... *B81C 3/001* (2013.01); *B81B 2203/0315* (2013.01); *B81B 2207/07* (2013.01)

(56) References Cited

U.S. PATENT DOCUMENTS

2016/0264403 A1* 9/2016 Chowdhury ............ B81C 3/001
2020/0391999 A1* 12/2020 Fukumitsu .......... B81C 1/00325

* cited by examiner

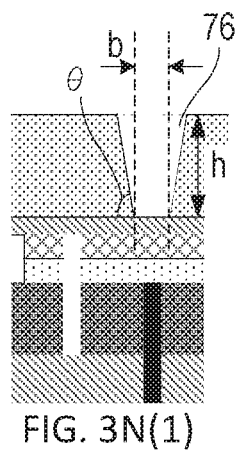
FIG. 3N(1)
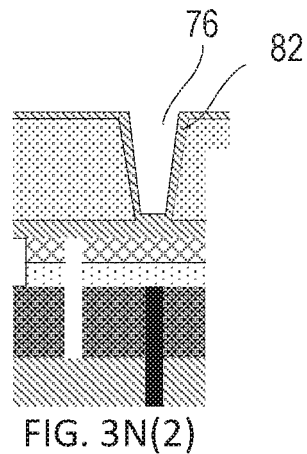
FIG. 3N(2)
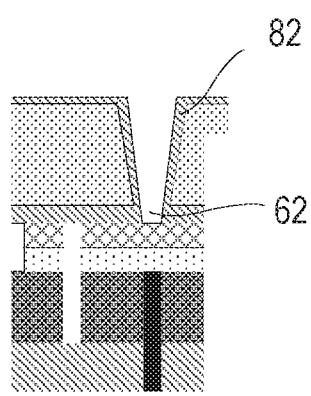
FIG. 3N(3)
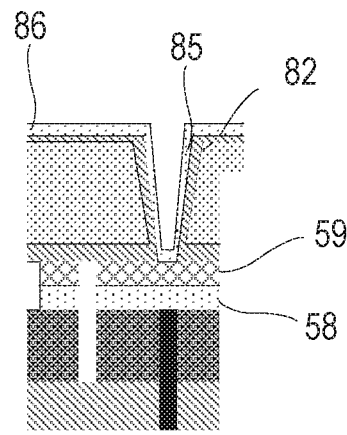
FIG. 3N(4)
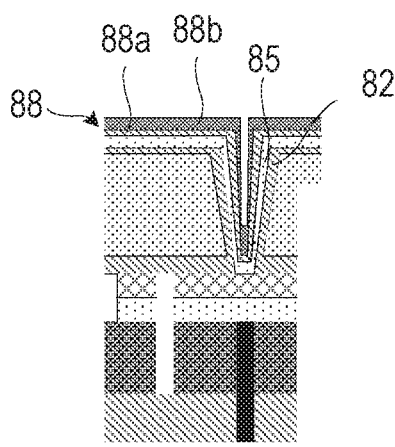
FIG. 3N(5)

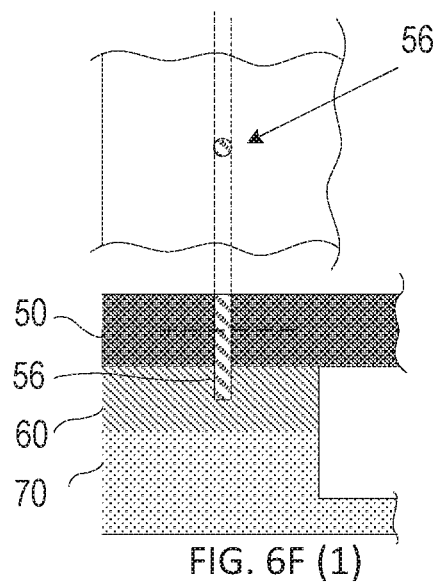
FIG. 6F (1)
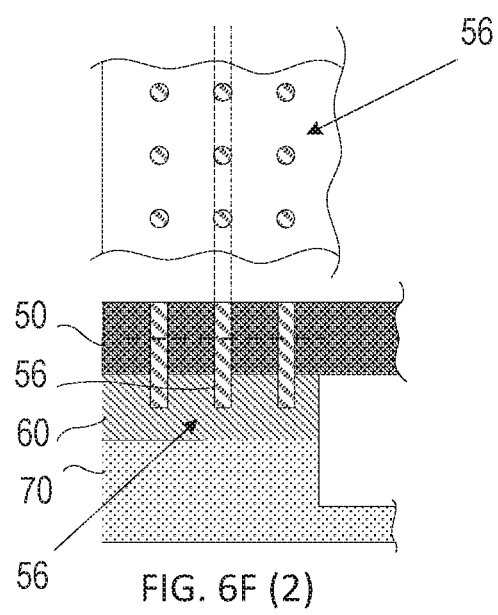
FIG. 6F (2)

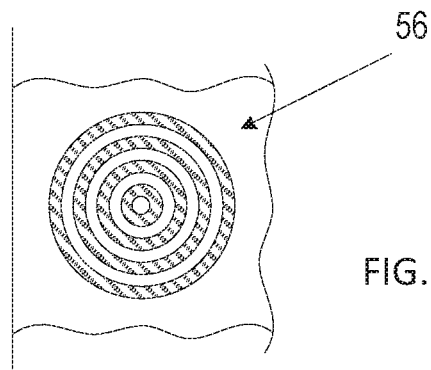
FIG. 6F (3)
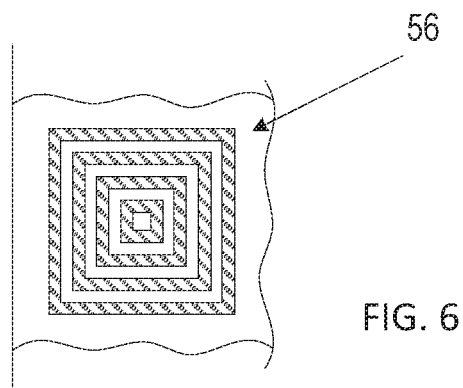
FIG. 6F (4)
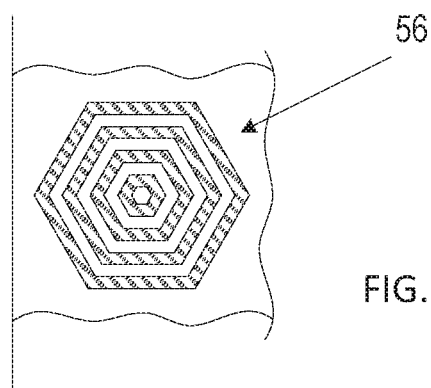
FIG. 6F (5)

CMOS-MEMS INTEGRATION WITH THROUGH-CHIP VIA PROCESS

REFERENCE TO RELATED APPLICATION

This Application claims the benefit of U.S. Provisional Application No. 62/752,545, filed on Oct. 30, 2018, the contents of which are hereby incorporated by reference in their entirety.

BACKGROUND

Microelectromechanical system (MEMS) devices, such as accelerometers, pressure sensors, and gyroscopes, have found widespread use in many modern day electronic devices. For example, MEMS accelerometers are commonly found in automobiles (e.g., in airbag deployment systems), tablet computers, or in smart phones. For many applications, MEMS devices are electrically connected to complementary metal-oxide semiconductor (CMOS) devices to form complete MEMS systems. Commonly, the connections are formed by wire bonding, but other approaches are also possible.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
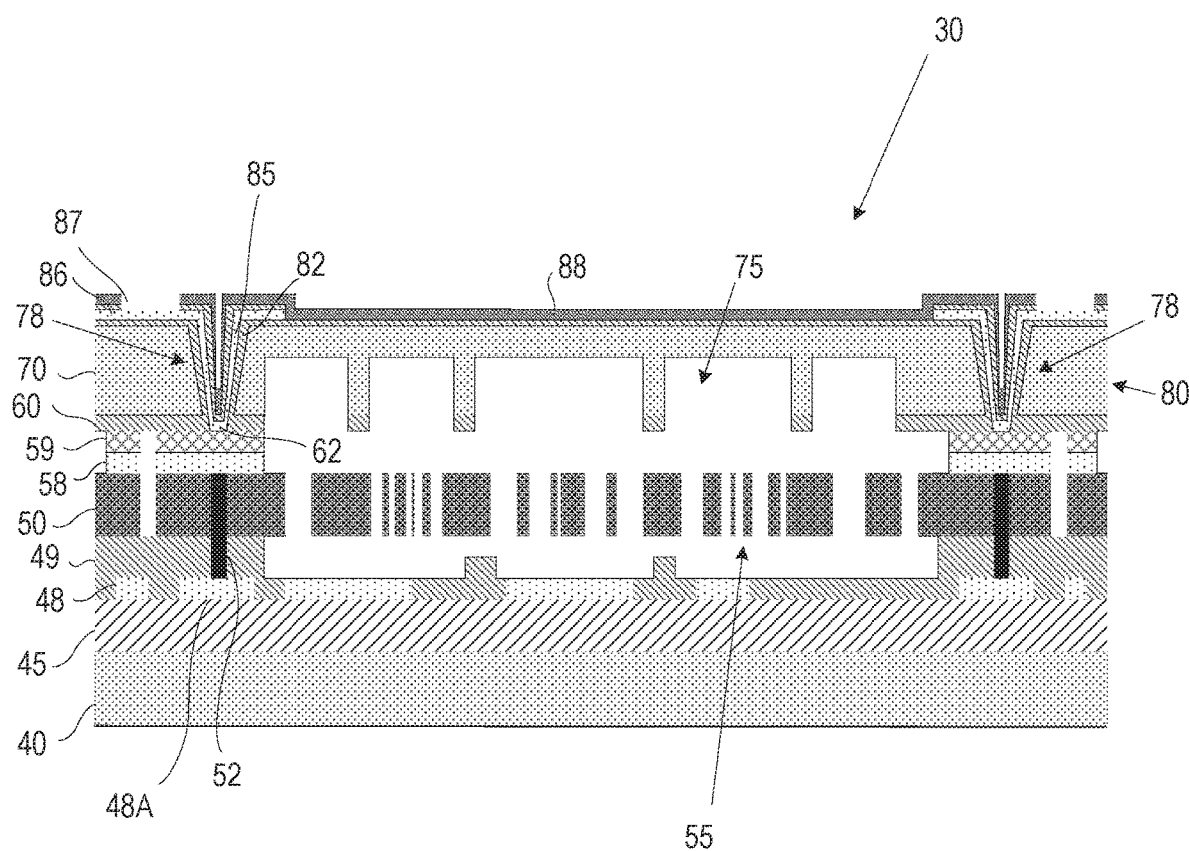
FIG. 1 is a cross-section view of an integrated CMOS-MEMS device that has a through-chip via connection in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To an increasing extent, modern day electronic devices are incorporating microelectromechanical system (MEMS) devices for numerous applications. For many applications, the MEMS devices are electrically connected to, and packaged with, application-specific integrated circuits (ASICs). These ASICs may have functions to serve as interfaces between the MEMS devices and other electronic devices. The MEMS devices can be fabricated on a MEMS wafer, while the ASICs can be fabricated on a CMOS wafer. Additionally, a cap wafer is also provided in the fabrication process. The bottom surface of the cap wafer includes recesses corresponding to the MEMS devices. When the cap wafer is arranged over and secured to the MEMS wafer, chambers including the recesses are formed over and abutting corresponding MEMS devices between the MEMS and cap wafers.

Traditionally, the electric bonding pads on the top of the CMOS wafer are covered by the MEMS and the cap wafer after eutectic bonding. During the fabrication process, some parts of the MEMS wafer and the cap wafer may need to be removed to expose the electric bonding pads to electrically connect the MEMS devices with the ASICs. The process of removing some parts in the MEMS wafer and cap wafer may increase the cost of fabrication and result in the waste of large device areas. In view of the foregoing, the present disclosure is directed to methods for CMOS-MEMS integration that uses through-chip via process. One type of the through-chip via is the through-silicon via ("TSV").

Traditional TSV structure needs deep reactive ion etching ("DRIE") to etch through whole silicon substrate. Sometime, the cap wafer can be quite thick such that it can be difficult to make the corresponding taper TSV profile and difficult to control for the following isolation layer deposition and metal layer deposition. In view of the foregoing, the present disclosure is also directed to methods for CMOS-MEMS integration that uses through-chip via process with improved through-chip via structures, such as, improved TSV structures.

FIG. 1 is a cross-section view of an integrated CMOS-MEMS device that has a through-chip via connection in accordance with some embodiments. In FIG. 1, the integrated CMOS-MEMS device 30 includes a CMOS structure 45 that is fabricated on a CMOS substrate 40. The CMOS structure 45 includes some CMOS devices and one or more conducting layers. While the CMOS structure 45 generally can include multiple conducting layers, only top level conducting layer 48 is shown in the figure. The integrated CMOS-MEMS device 30 also includes a MEMS structure 55 and a cap structure 80. An isolation layer 60 deposited is on a first side of the cap structure 80, and a conductive routing layer 86 is deposited on a second side of the cap structure 80. The MEMS structure 55, which includes at least one MEMS device, is deposited between the CMOS substrate 40 and the isolation layer 60 on the cap structure. One or more vias 78 passes through the cap structure 80. Any one of the vias 78 can be a through-chip via that passes through the cap wafer of the cap structure 80. When the cap structure 80 is fabricated with a silicon wafer, any one of the vias 78 can be a through-silicon via ("TSV").

In FIG. 1, a conducting pad 58 is deposited on a surface of the MEMS structure 55. The conducting pad 58 is bonded with the isolation layer 60 and with the bonding-pad 59 in a bonding layer for forming the eutectic bonding. In one embodiment, the bonding-pad 59 is a layer of Germanium (Ge). A conductive contact 85, after passing through one of the vias 78 and through an opening 62 in the isolation layer 60 on the cap structure 80, conductively connects a conductive path in the conductive routing layer 86 with the conducting pad 58. The conducting pad 58 is also conductively connected to one of the pad 48A in the top conducting layer 48 of the CMOS structure 45. In one embodiment, the conducting pad 58 is also conductively connected to one of the pad 48A through a conductive element 52 that is formed with conductive material, such as tungsten (W). With the combination of the conductive contact 85 through the vias 78, the conducting pad 58, and the conductive element 52, a conductive path in the conductive routing layer 86 that is deposited on the cap structure 80 can be conductively connected to a conducting layer in the CMOS structure 45.

FIG. 2A-2D are flow charts showing a method 200 of fabricating an integrated CMOS-MEMS device that has through-chip vias for electrically connecting CMOS structures with other devices in accordance with some embodiments. An example of the device fabricated with this method is the integrated CMOS-MEMS device 30 as shown in FIG. 1. FIGS. 3A-3O are cross-section views of device structures for showing a method of fabricating an integrated CMOS-MEMS device 30 in accordance with some embodiments.

Figure 2A:
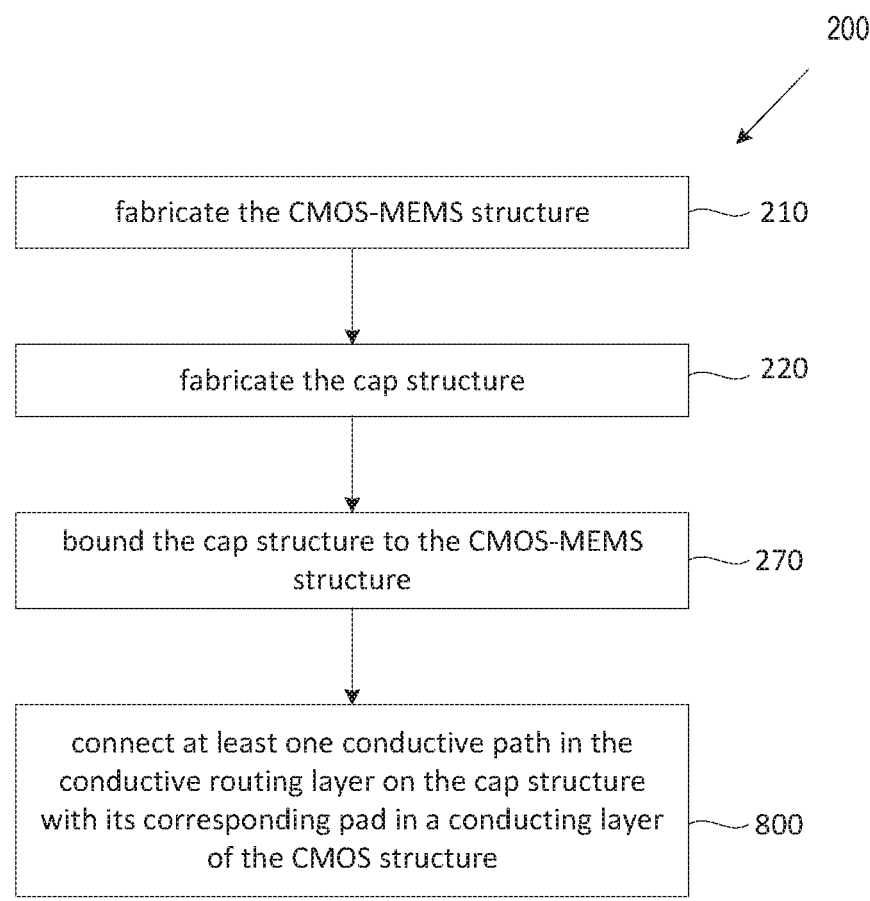
FIG. 2A-2D are flow charts showing a method of fabricating an integrated CMOS-MEMS device that has through-chip vias for electrically connecting CMOS structures with other devices in accordance with some embodiments.
Figure 3A:
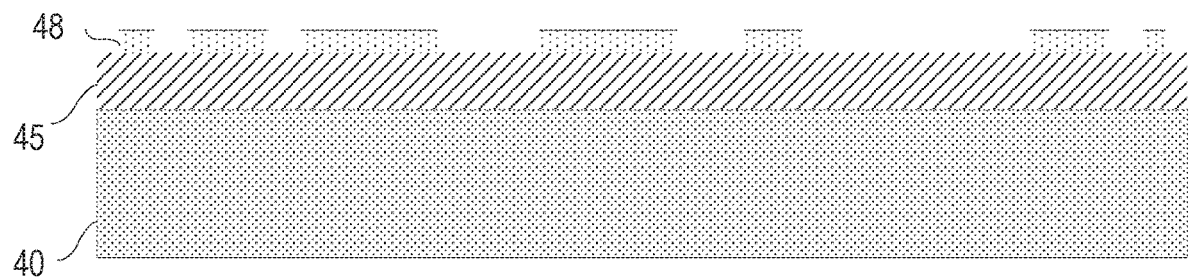
FIGS. 3A-3O are cross-section views of device structures for showing a method of fabricating an integrated CMOS-MEMS device in accordance with some embodiments.
Figure 3B:
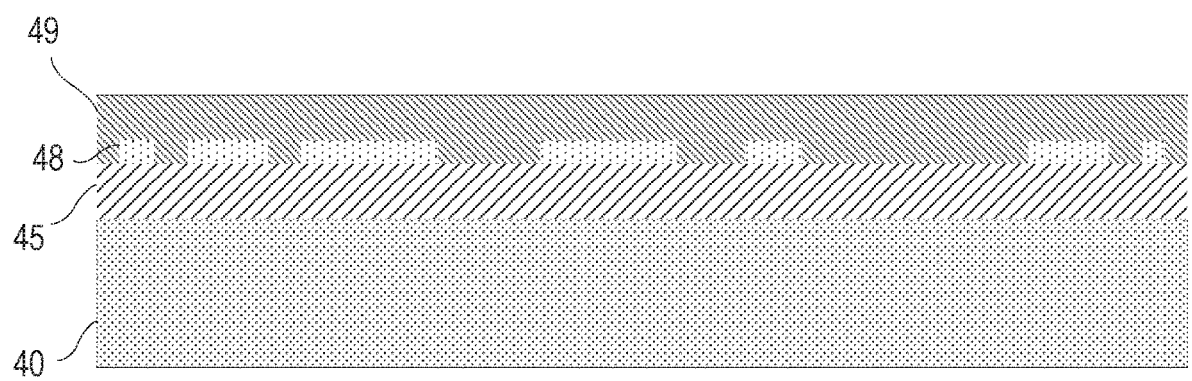
Figure 3C:
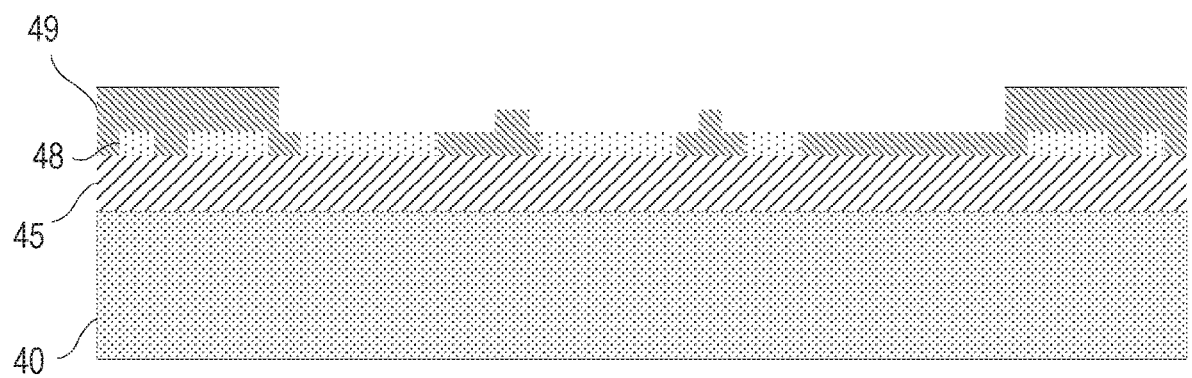
Figure 3D:
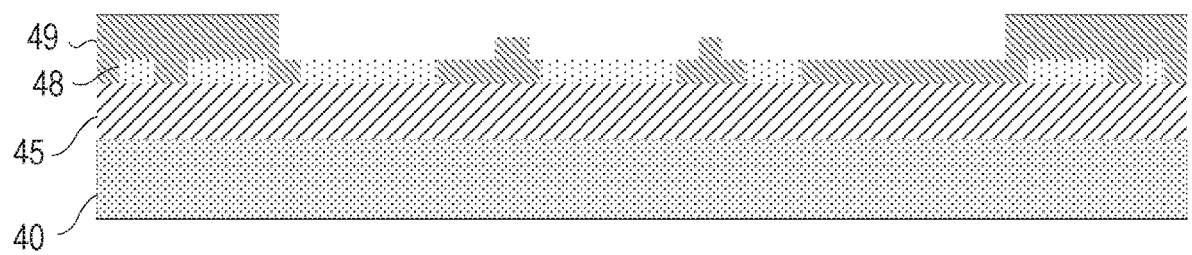
Figure 3E:
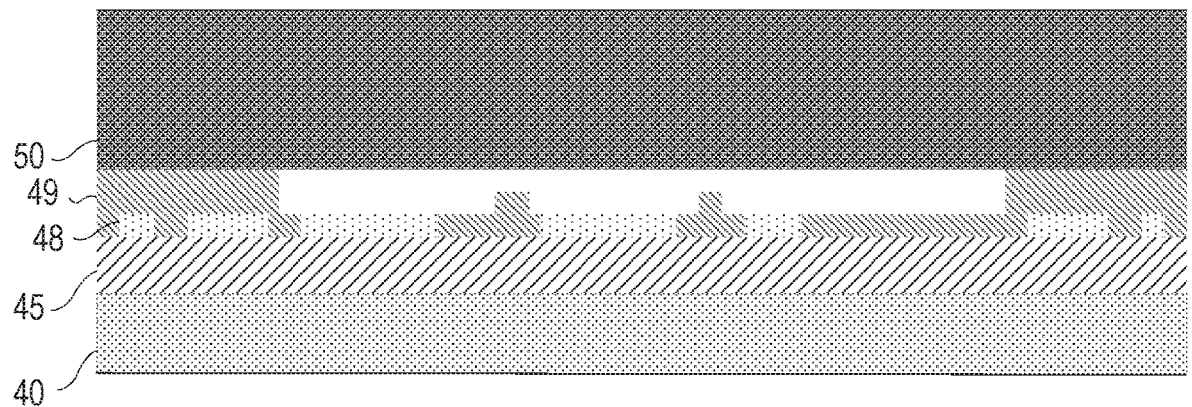
Figure 3F:
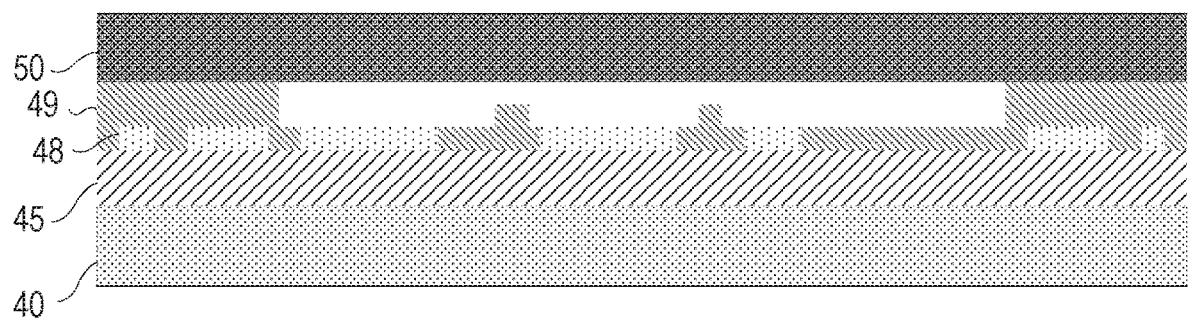
Figure 3G:
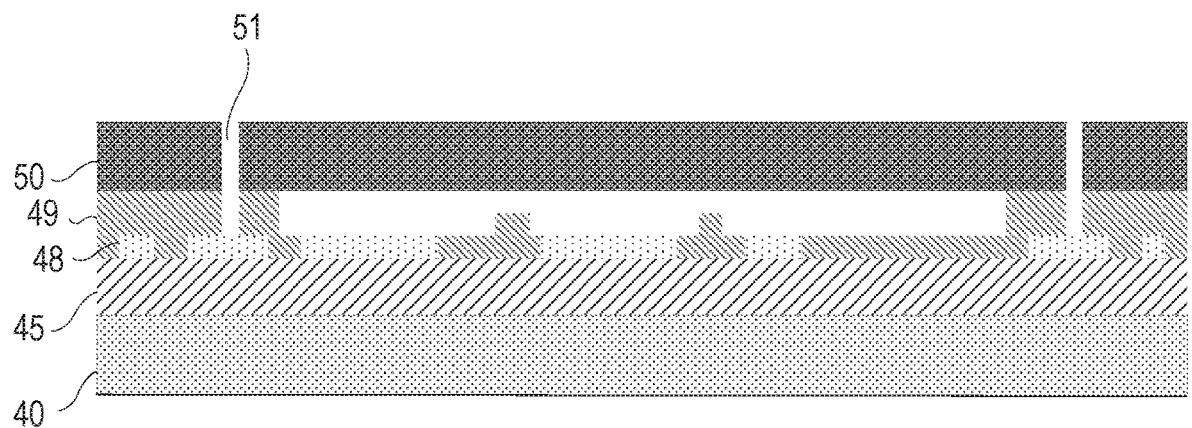
Figure 3H:
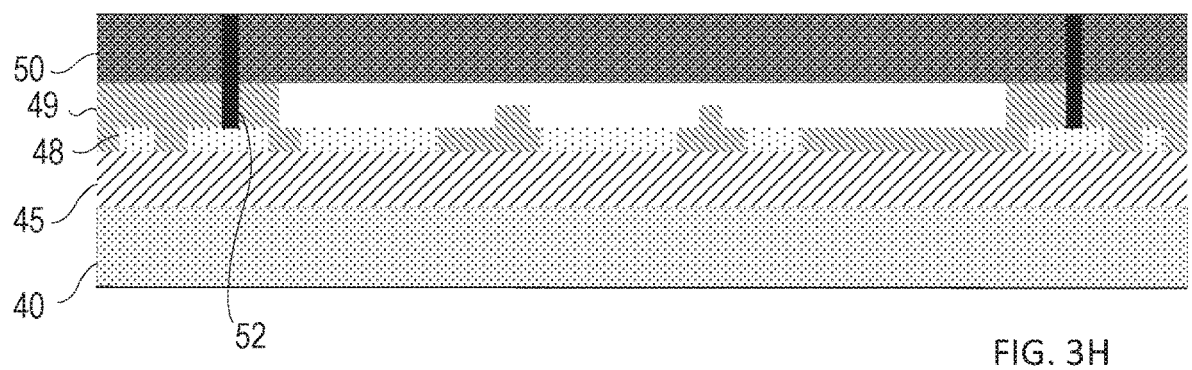
Figure 3I:
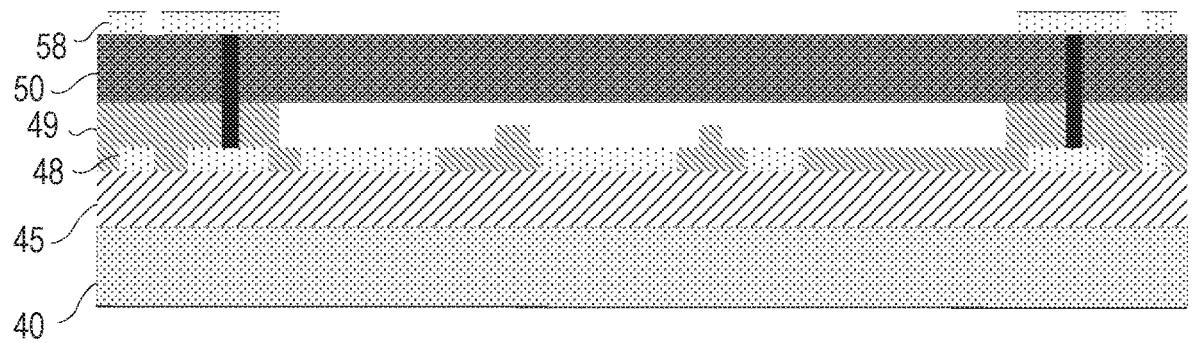
Figure 3J:
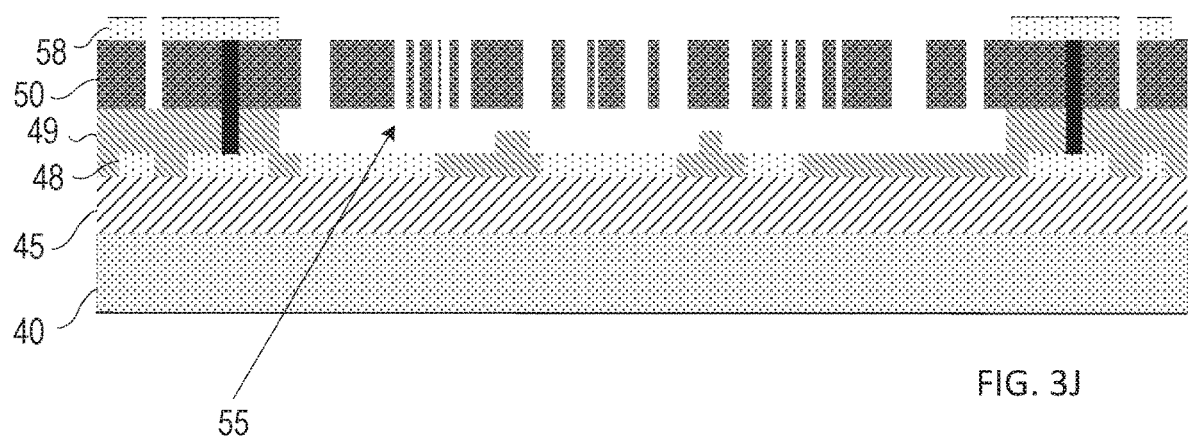
Figure 3K:
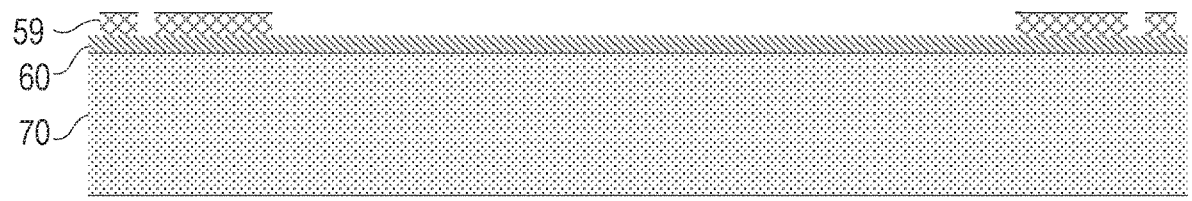
Figure 3L:
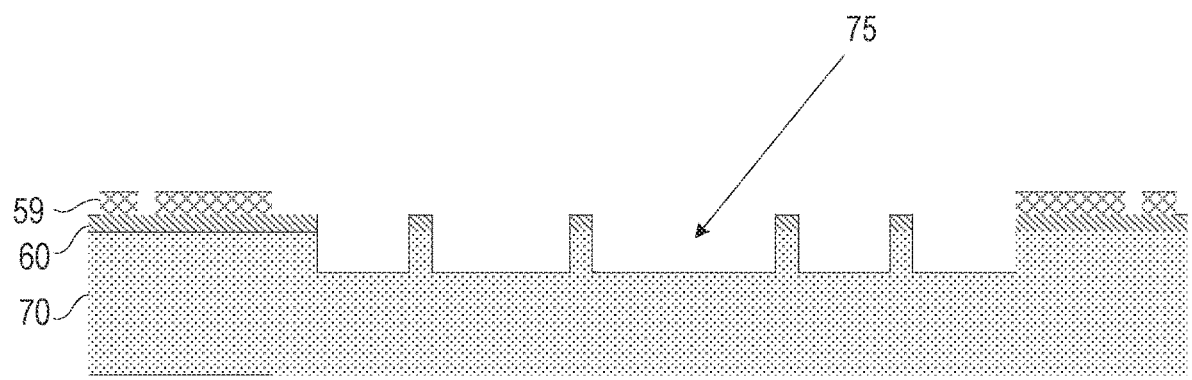
Figure 3M:
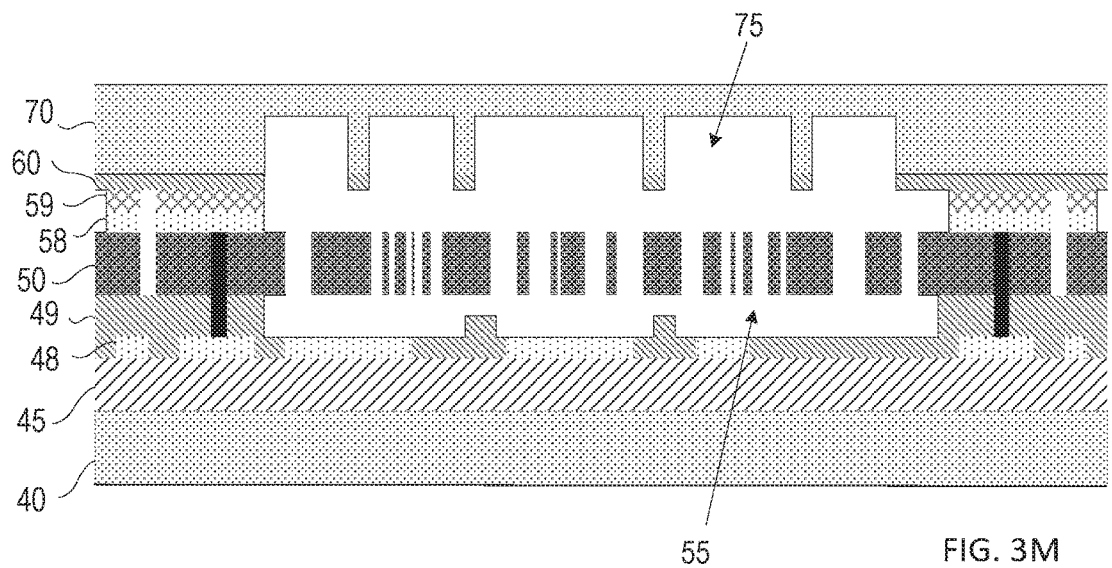
Figure 3N:
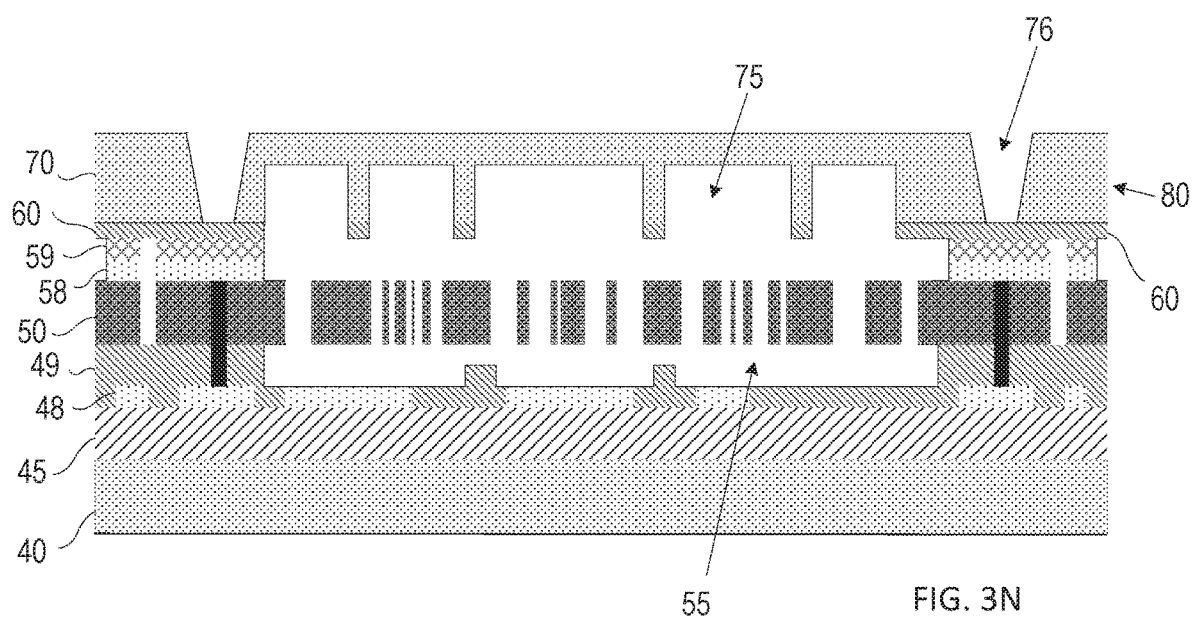
Figure 3O:
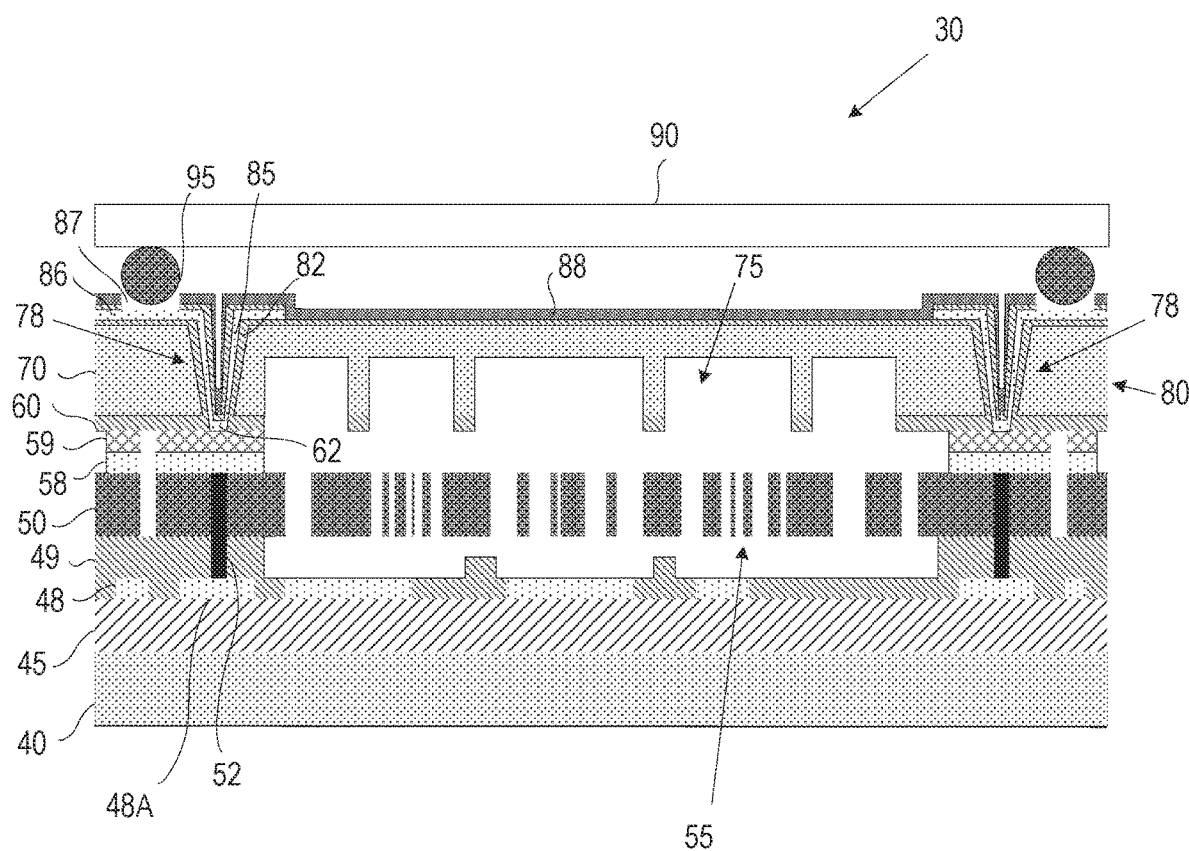

In the method 200 as shown in FIG. 2A, at 210, the CMOS-MEMS structure is fabricated. An example of the CMOS-MEMS structure fabricated at 210 is the device structure as shown in FIG. 3J. At 220, the cap structure is fabricated. An example of the cap structure fabricated at 220 is the device structure as shown in FIG. 3L. Next, at 270, the cap structure is bonded to the CMOS-MEMS structure. In one example, as shown in FIG. 3M, the cap structure in FIG. 3L is bonded with the CMOS-MEMS structure in FIG. 3J. Next, at 800, at least one conductive path in the conductive routing layer on the cap structure is conductively connected with its corresponding pad in a conducting layer of the CMOS structure. In one example, as shown in FIG. 3O, a conductive path in the conductive routing layer 86 is conductively connected with a pad 48A in the top conducting layer of the CMOS structure 45, after a conductive contact 85 for connecting to the conducting pad 58 is formed in the via 78, when the conducting pad 58 is conductively connected to the pad 48A.

Figure 2B:
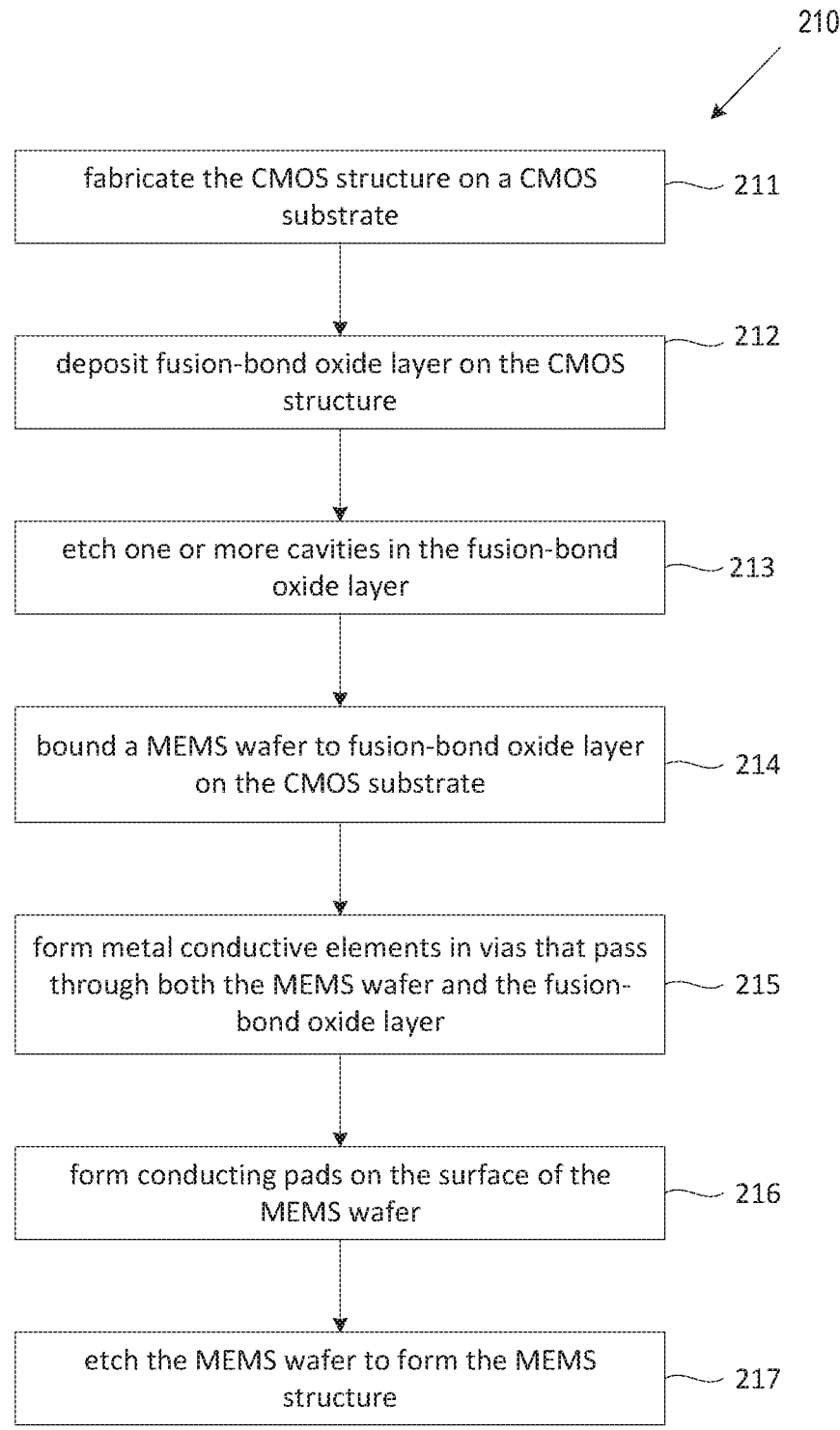

FIG. 2B is a flowchart showing the step 210 in the method 200 of FIG. 2A, in which the CMOS-MEMS structure is fabricated. The step 210 includes blocks 211, 212, 213, 214, 215, 216, and 217. At 211, the CMOS structure is fabricated on a CMOS substrate. The CMOS structure is processed until the top metal layer is patterned and processed. In one embodiment, as shown in FIG. 3A, the CMOS structure 45 is fabricated on the CMOS substrate 40. After the top metal layer (e.g., AlCu) is patterned and processed, conductive pads are formed in the top metal layer 48. The conductive pads in the top metal layer 48 can provide various electrical connections between various electrical components in the CMOS structure 45. Even through only the top metal layer is shown in FIG. 3A, the CMOS structure 45 generally can include multiple conductive layers to provide more complicated connections between various electrical components.

Next, at 212, an oxide layer for fusion-bond is deposited on the CMOS structure; and at 213, one or more cavities are etched in this fusion-bond oxide layer. In one embodiment, as shown in FIG. 3B, a layer of silicon oxide 49 is disposed over the CMOS structure 45 having the top metal layer using a High Density Plasma (HDP) deposition Process. After an oxide densification process, this layer of silicon oxide 49 is subject to a polish process, such as chemical mechanical polishing (CMP) process, for planarization. In FIG. 3C, cavities are etched in the layer of silicon oxide 49, and the etching process can be stopped at the top metal layer (e.g., AlCu) of the CMOS structure 45. In some embodiments, as shown in FIG. 3D, the CMOS substrate 40 for supporting the CMOS structure 45 can be thin down to a thickness as designed, which can be in a range from 150 um to 300 um.

Next, at 214, a wafer 50 for fabricating MEMS structure is bonded to the fusion-bond oxide layer on the CMOS substrate. In one embodiment, as shown in FIG. 3E, the MEMS wafer 50 is bonded to the fusion-bond oxide layer 49; the device structure as shown in FIG. 3E is then subjected to post bonding annealing. In some embodiments, as shown in FIG. 3F, the MEMS wafer 50 can be thin down to a thickness as designed, which can be in a range from 50 um to 250 um.

Next, at 215, metal conductive elements for connecting to the conductive pads of the CMOS structure is formed in vias, with the metal conductive elements passing through both the MEMS wafer and the fusion-bond oxide layer on the CMOS substrate. In one embodiment, as shown in FIG. 3G, etching processes are used to form the vias 51 through the MEMS wafer and the bond oxide layer 49. Specifically, a process for etching through the MEMS wafer 50 (e.g., a silicon wafer) is followed by a process for etching through the fusion-bond oxide layer 49 (e.g., a silicon oxide layer). When the etching stops at the pad 48A (e.g., a pad formed in an AlCu layer), the vias 51 through the MEMS wafer and the bond oxide layer are formed. After the formation of the vias 51, metal conductive elements 52 in the vias 51 are formed as shown in FIG. 3H. In one embodiment, when metallic material such as tungsten (W) is deposited towards the MEMS wafer 50 to fill in the vias 51 through both the MEMS wafer 50 and the bond oxide layer 49, metal conductive elements 52 are formed in the vias 51 and connected to the conductive pads 48A of the CMOS structure 45. In FIG. 3H, after the deposition of the metallic material (e.g., tungsten), CMP process can be used to remove residual metallic material on the MEMS wafer 50 formed during the deposition process and to subject the surface of the MEMS wafer 50 for planarization.

Next, at 216, conducting pads is formed on the surface of the MEMS wafer. In one embodiment, as shown in FIG. 3I, after a layer of conductive material (e.g., an AlCu layer) is deposited on the surface of the MEMS wafer 50, this layer of conductive material is then patterned to form the conducting pads 58.

Next, at 217, the MEMS wafer is etched to form the MEMS structure. In one embodiment, as shown in FIG. 3J, the MEMS wafer 50 is etched to form the MEMS structure 55. In some embodiments, during the process of etching the MEMS wafer 50, some isolation structures (e.g., isolation trenches) can be formed at the same time. When the MEMS wafer 50 is a silicon wafer, the process of etching the silicon generally can be stopped at the bond oxide layer 49 when the etching process used has good selectivity.

After the process at 217, the fabricated CMOS-MEMS structure (e.g., the device structure as shown in FIG. 3J) can be used for bonding with the cap structure (e.g., the device structure as shown in FIG. 3L).

Figure 2C:
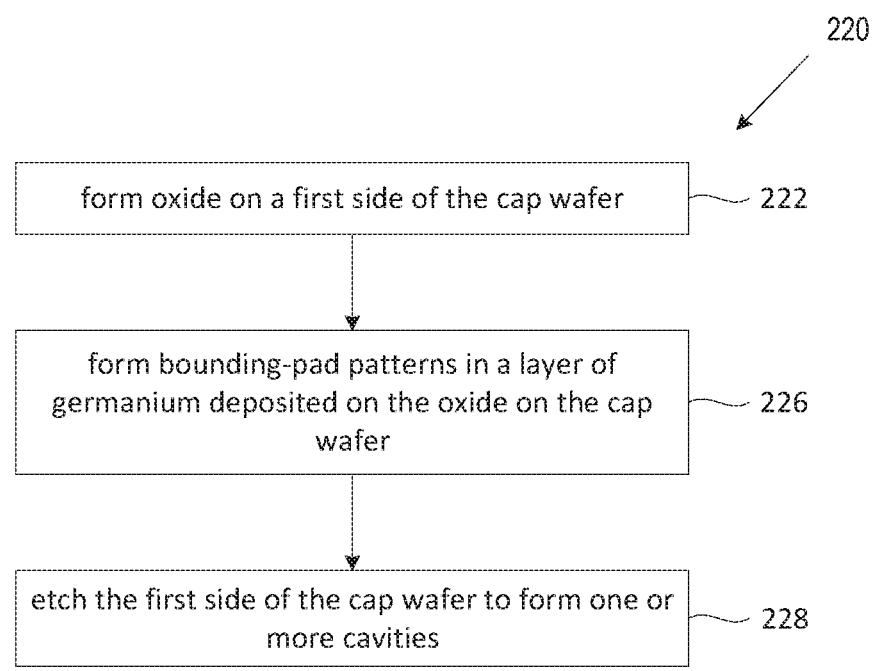

FIG. 2C is a flowchart showing the step 220 in the method 200 of FIG. 2A, in which the cap structure is fabricated. The step 220 includes blocks 222, 226, and 228. At 222, a layer of oxide is formed on a first side of the cap wafer; at 226, bonding-pad patterns are formed in a layer of germanium deposited on the oxide on the cap wafer; and at 228, the first side of the cap wafer is etched to form one or more cavities. In one embodiment, as shown in FIG. 3K, the layer of oxide 60 is formed on a first side of the cap wafer 70. In some embodiments, this layer of oxide 60 can be formed by way of a thermal process. In other embodiments, this layer of oxide 60 can be formed by a deposition process, such as, chemical vapor deposition (CVD) or atomic layer deposition (ALD). In FIG. 3K, after a layer of germanium is deposited on the layer of oxide 60 on the cap wafer 70, this layer of germanium is then patterned to form the bonding-pad 59. In FIG. 3L, after the formation of the bonding-pad 59, the first side of the cap wafer 70 is etched to form one or more cavities 75.

After the process at 228, the fabricated cap structure (e.g., the device structure as shown in FIG. 3L) can be used for bonding with the CMOS-MEMS structure (e.g., the device structure as shown in FIG. 3J).

In the method 200 of FIG. 2A, the step 270 involves bonding the cap structure to the CMOS-MEMS structure. In one embodiment, as shown in FIG. 3M, after the cap structure in FIG. 3L is bonded with the CMOS-MEMS structure in FIG. 3J, eutectic bond can be formed between the bonding-pad 59 in the cap structure and the conducting pads 58 in the CMOS-MEMS structure.

Figure 2D:
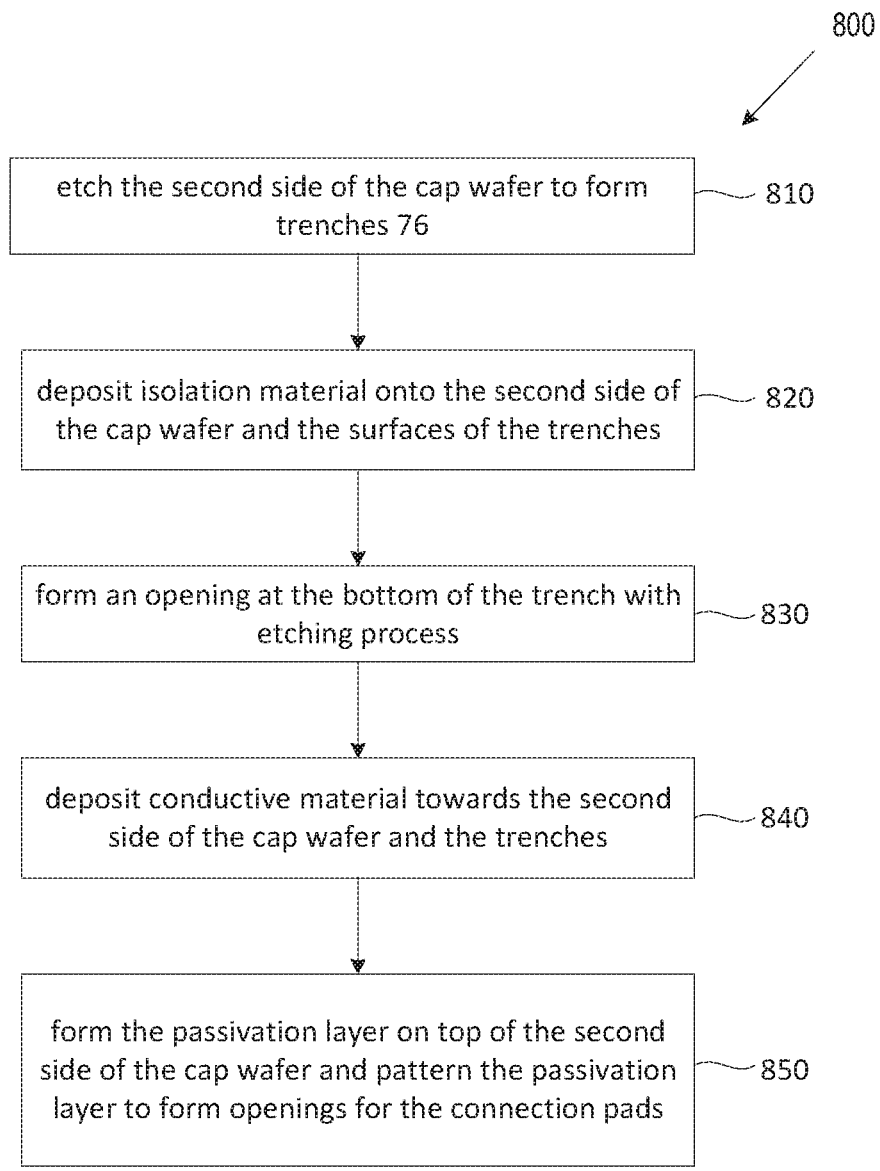

In the method 200 of FIG. 2A, at the step 800, conductive paths on the cap structure are conductively connected with their corresponding pads on the CMOS structure. FIG. 2D is a flowchart showing the step 800 that includes blocks 810, 820, 830, 840, and 850.

At 810, the second side of the cap wafer is etched to form trenches. In one embodiment, as shown in FIG. 3N, trenches 76 are formed in the second side of the cap wafer 70 with an etching process when the etching stops at the oxide layer 60. One of the trenches 76 as shown in FIG. 3N(1) has a height "h", a bottom width "b", and a sidewall angle "θ". The height "h" can be in a range from 200 um to 400 um; the bottom width "b" can be in a range from 30 um to 100 um; and the sidewall angle "θ" can be in a range from 60 degrees to 85 degrees. In some embodiments, the size of the bottom width "b" depends on ASIC requirement.

Next, at 820, isolation material is deposited onto the second side of the cap wafer and the surfaces of the trenches. In one embodiment, as shown in FIG. 3N(2) and FIG. 3O, a layer of isolation oxide 82 is deposited onto the second side of the cap wafer 70 and the surfaces of the trenches 76. The layer of isolation oxide 82 can be in a range from 500 nm to 1000 nm.

Then, at 830, an opening is formed at the bottom of the trench. In one embodiment, as shown in FIG. 3N(3) and FIG. 3O, an opening 62 is formed at the bottom of the trench 76 with an etching process. The etching process removes parts of the isolation oxide 82 and the oxide layer 60 at the bottom of the trench 76 to form the opening 62.

Next, at 840, conductive material is deposited towards the second side of the cap wafer and the trenches. In one embodiment, as shown in FIG. 3N(4) and FIG. 3O, when conductive material (e.g., AlCu) is deposited towards the second side of the cap wafer 70 and the trenches 76, a layer of the conductive material (e.g., AlCu) is formed on the second side of the cap wafer 70 and the sidewalls of the trench 76, forming in the trench 76 the conductive contact 85 that is connected to the conducting pad 58 through the bonding-pad 59. The layer of the conductive material (e.g., AlCu) can be in a range from 500 nm to 1500 nm.

In some embodiments, as shown in FIG. 3O, the layer of the conductive material for forming the conductive contact 85 also serves as the conductive routing layer 86. When the conductive routing layer 86 is patterned to form conductive paths on the cap wafer 70, the conductive contact 85 can be implemented to connect the conducting pad 58 with one or more conductive paths on the cap wafer 70. In some embodiments, conductive paths on the cap wafer 70 can be formed separately in another conductive layer that is different from the layer of the conductive material for forming the conductive contact 85, and the conductive contact 85 can still be implemented to connect the conducting pad 58 with one or more conductive paths formed in this other conductive layer on the cap wafer 70.

Next, at 850, the passivation layer is formed on top of the second side of the cap wafer, and the passivation layer patterned to form openings for the connection pads. In one embodiment, as shown in FIG. 3N(5) and FIG. 3O, the passivation layer 88 is formed on top of the second side of the cap wafer 70 by depositing a layer of oxide 88a and a layer of silicon nitride 88b. The layer of oxide 88a can be in a range from 500 nm to 1000 nm. The layer of silicon nitride 88b can be in a range from 500 nm to 1000 nm. In FIG. 3O, openings 87 can be formed in the passivation layer 88 by patterning and removing some parts of the layer of oxide and the layer of silicon nitride. The openings 87 can expose the connection pads for connecting the integrated CMOS-MEMS device 30 with other external electronic elements, such as, the electronic circuits on a PC board. In some embodiments, as shown in FIG. 3O, the connection pads at the openings 87 can be connected to other electronic elements through metal balls 95 (e.g. Sn). A PC board 90, positioned in parallel with the cap structure, can be connected to the integrated CMOS-MEMS device 30 through the metal balls 95.

Figure 4:
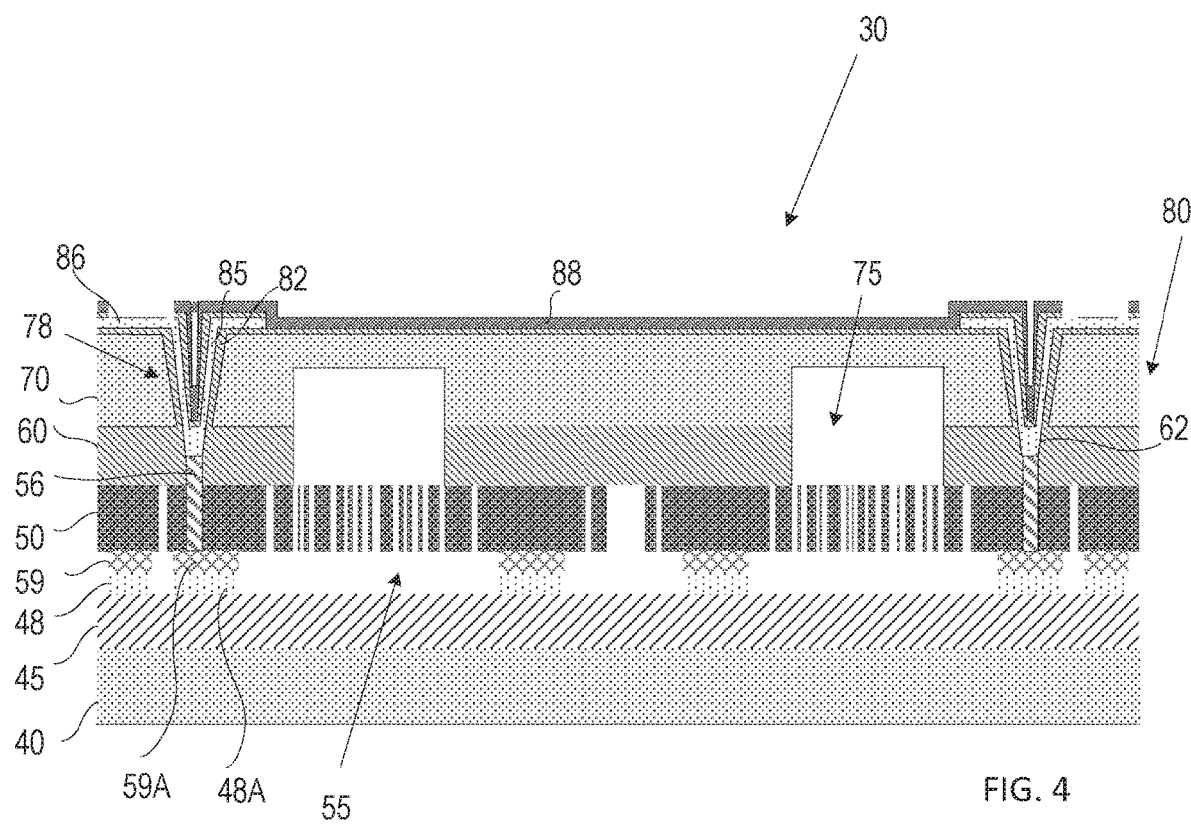
FIG. 4 is a cross-section view of another CMOS-MEMS device that has an improved through-chip via connection in accordance with some embodiments.

FIG. 4 is a cross-section view of another CMOS-MEMS device that has an improved through-chip via connection in accordance with some embodiments. In FIG. 4, the integrated CMOS-MEMS device 30 includes a CMOS structure 45 that is fabricated on a CMOS substrate 40. The CMOS structure 45 includes some CMOS devices and one or more conducting layers. While the CMOS structure 45 generally can include multiple conducting layers, only top level conducting layer 48 is shown in the figure. The integrated CMOS-MEMS device 30 also includes a MEMS structure 55 and a cap structure 80. An isolation layer 60 deposited is on a first side of the cap structure 80, and a conductive routing layer 86 is deposited on a second side of the cap structure 80. The MEMS structure 55, which includes at least one MEMS device, is deposited between the CMOS substrate 40 and the isolation layer 60 on the cap structure. One or more vias 78 passes through the cap structure 80. Any one of the vias 78 can be a through-chip via that passes through the cap wafer of the cap structure 80. When the cap structure 80 is fabricated with a silicon wafer, any one of the vias 78 can be a through-silicon via ("TSV").

In FIG. 4, the MEMS structure 55 is fabricated in a MEMS wafer 50 located between the CMOS substrate 40 and the isolation layer 60 on the cap structure 80. A silicon plug 56 passes through the MEMS wafer 50 and extends into the isolation layer 60 on the cap structure 80. One end of the silicon plug 56 is conductively connected to one of the pad 48A in the top conducting layer 48 of the CMOS structure 45. The other end of the silicon plug 56 is conductively connected to a conductive contact 85. The conductive contact 85 conductively connects a conductive path in the conductive routing layer 86 with the silicon plug 56, after passing through one of the vias 78 and through an opening 62 in the isolation layer 60 on the cap structure 80. In FIG. 4, the silicon plug 56 is conductively connected to the pad 48A of the CMOS structure 45 through a conductive bonding-pad 59. In one embodiment, the bonding-pad 59 is patterned in a layer of Germanium (Ge) which is used for forming the eutectic bonding between the CMOS structure 45 and the MEMS wafer 50.

Figure 5:
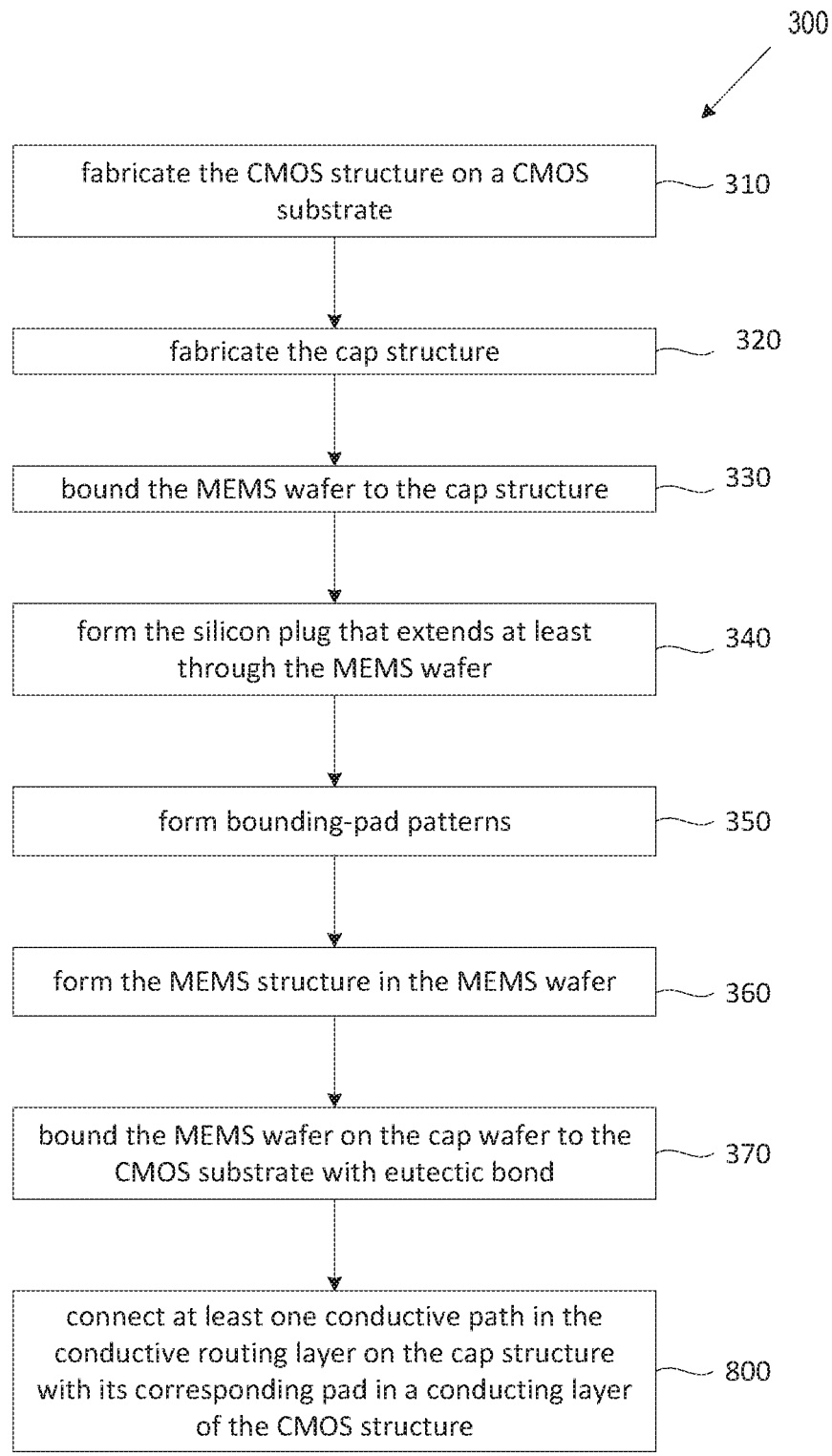
FIG. 5 is a flowchart showing a method of fabricating an integrated CMOS-MEMS device that has through-chip vias for electrically connecting CMOS structures with other devices in accordance with some embodiments.
Figure 6A:
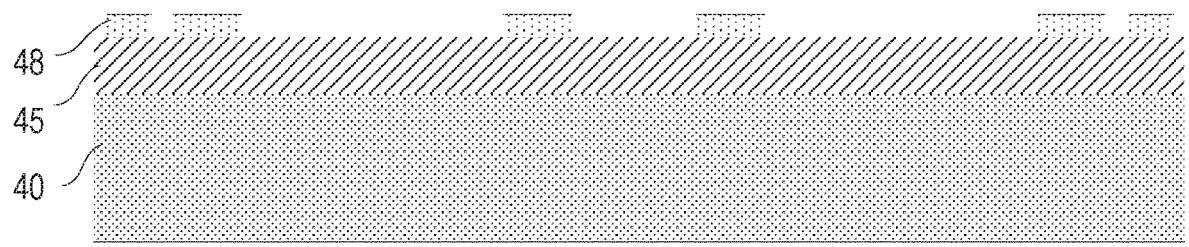
FIGS. 6A-6N are cross-section views of device structures for showing a method of fabricating an integrated CMOS-MEMS device in accordance with some embodiments.
Figure 6B:
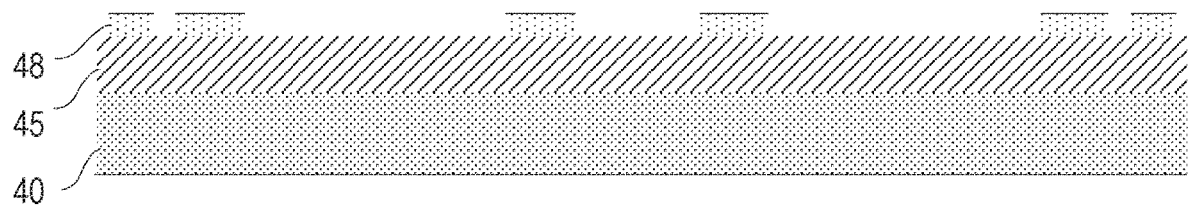
Figure 6C:
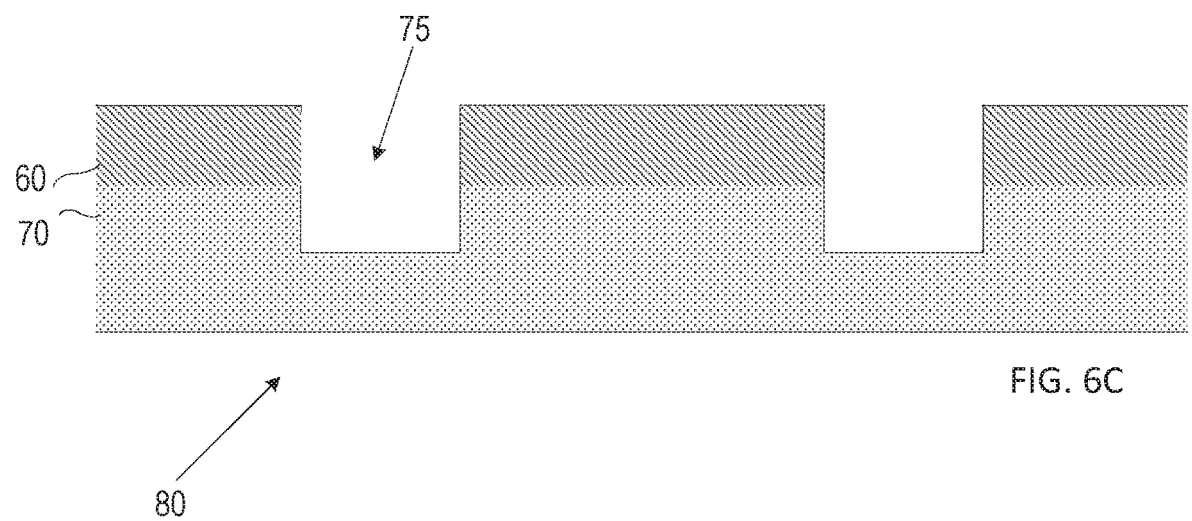
Figure 6D:
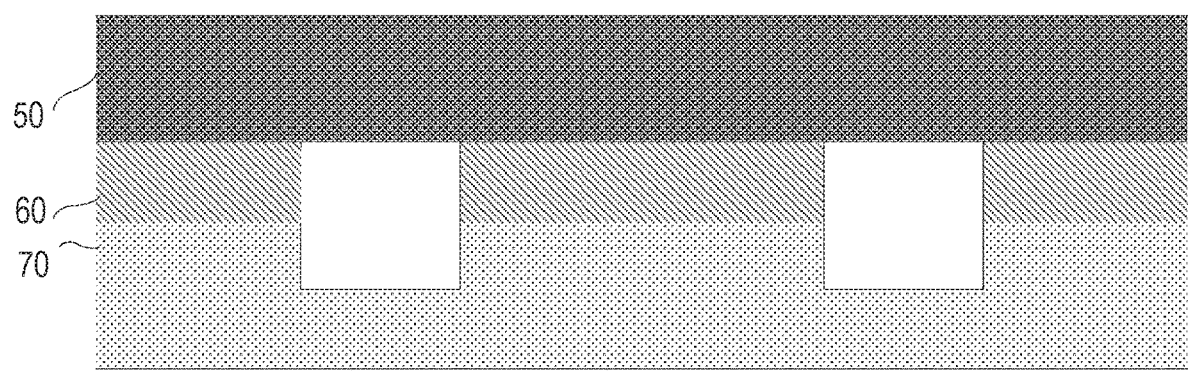
Figure 6E:
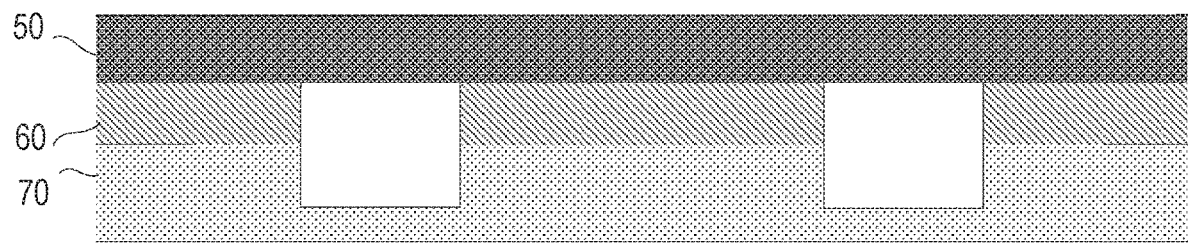
Figure 6F:
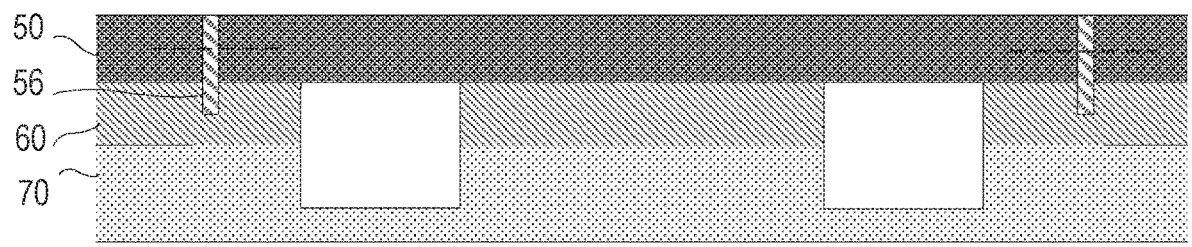
Figure 6G:
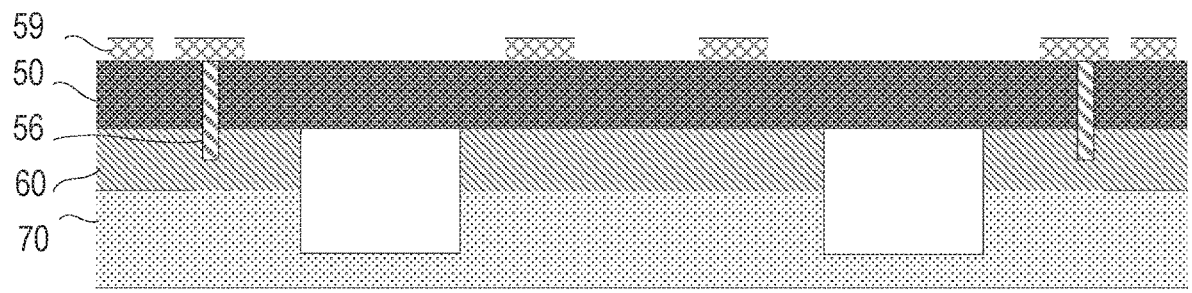
Figure 6H:
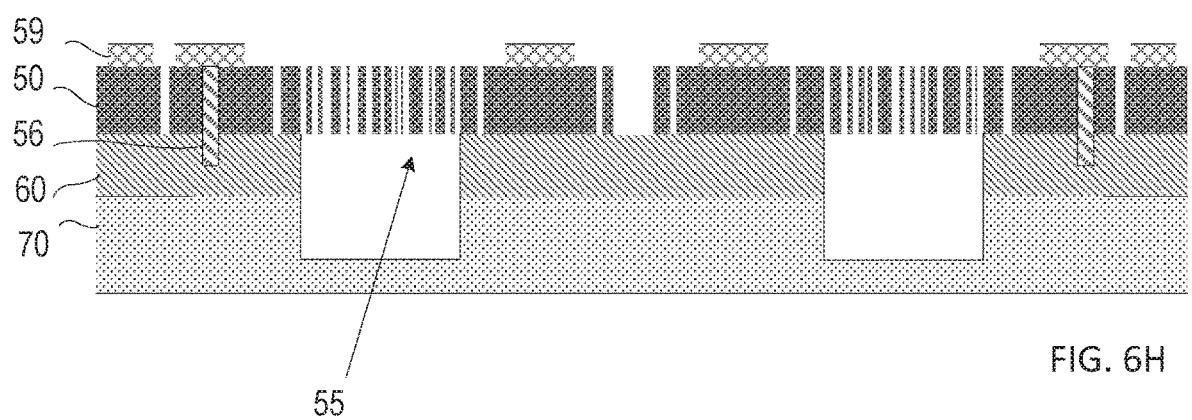
Figure 6I:
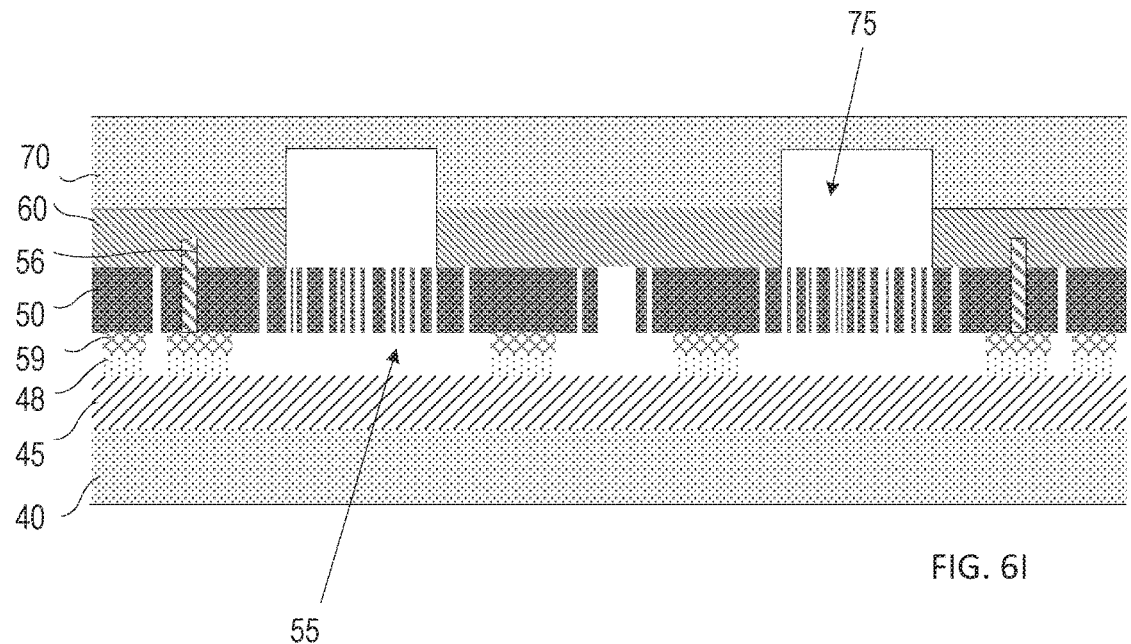
Figure 6J:
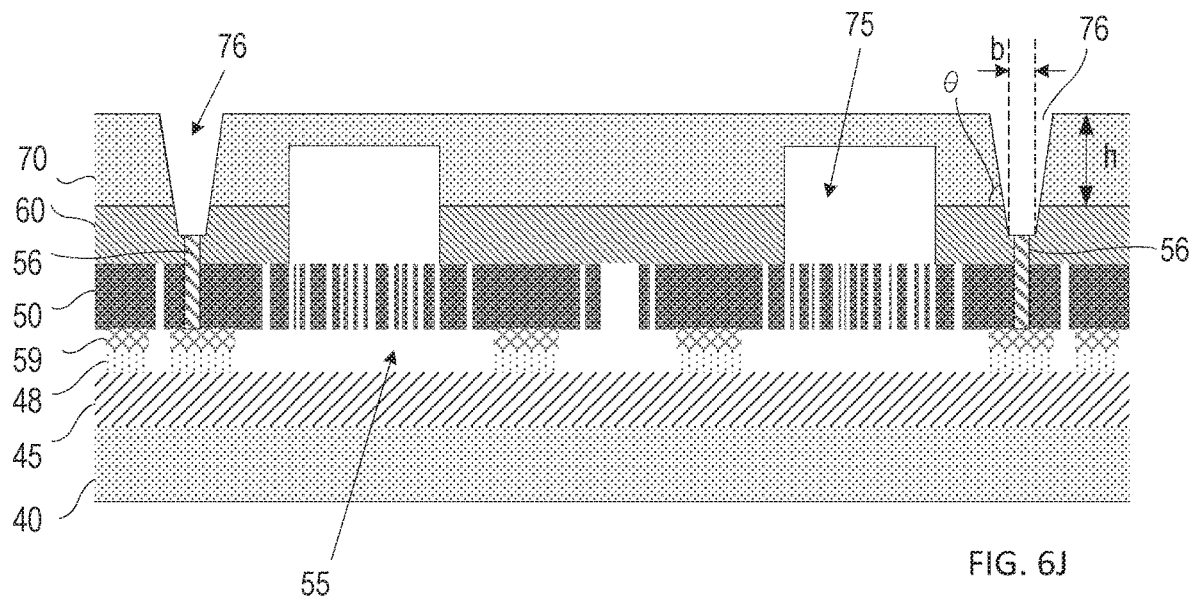
Figure 6K:
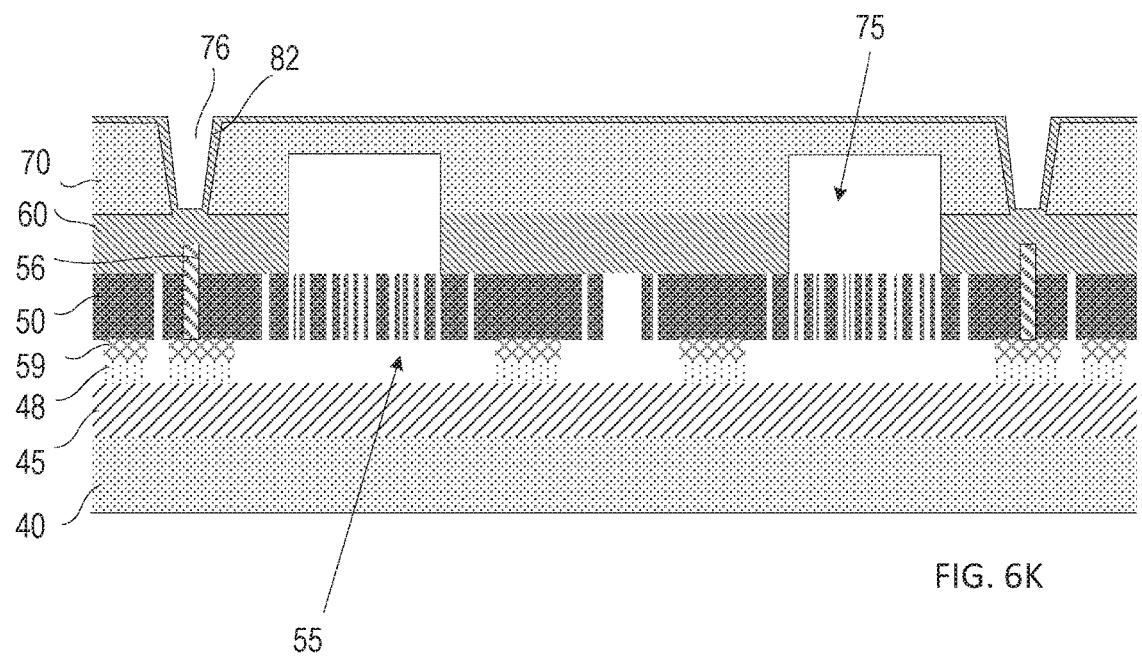
Figure 6L:
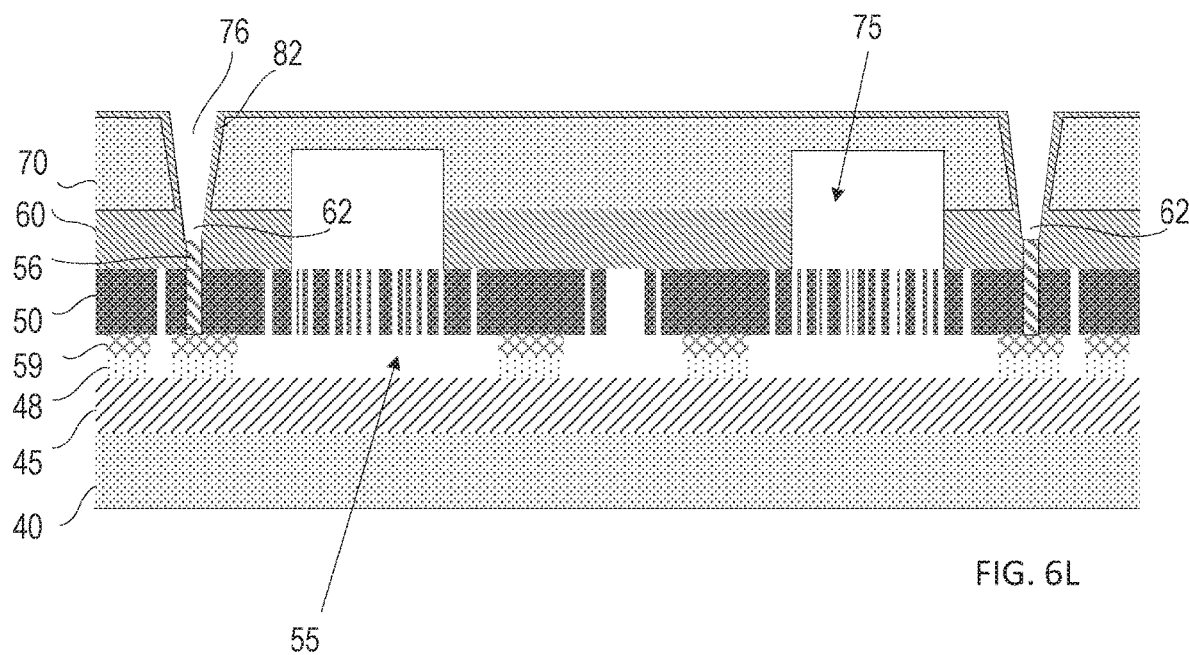
Figure 6M:
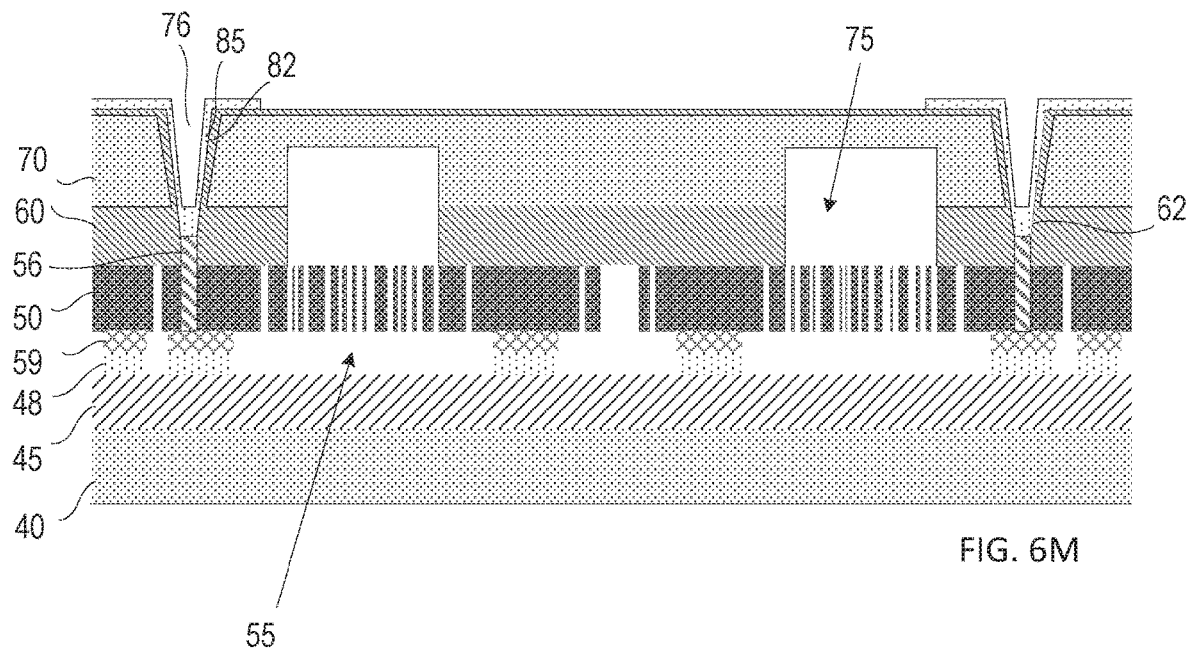
Figure 6N:
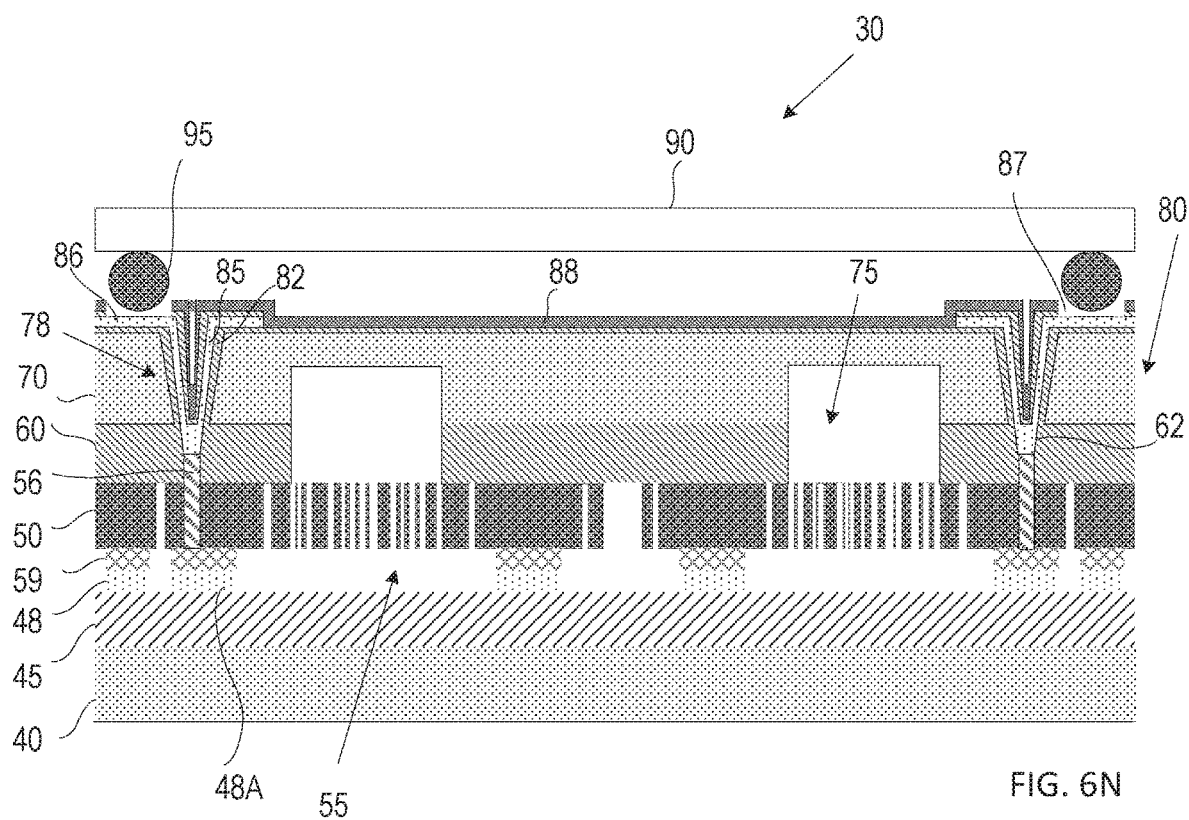

FIG. 5 is a flowchart showing a method 300 of fabricating an integrated CMOS-MEMS device that has through-chip vias for electrically connecting CMOS structures with other devices in accordance with some embodiments. An example of the device fabricated with this method is the integrated CMOS-MEMS device 30 as shown in FIG. 4. FIGS. 6A-6N are cross-section views of device structures for showing a method of fabricating an integrated CMOS-MEMS device 30 in accordance with some embodiments.

In the method 300 as shown in FIG. 5, at 310, the CMOS structure is fabricated on a CMOS substrate. The CMOS structure is processed until the top metal layer patterned and processed. In one embodiment, as shown in FIG. 6A, the CMOS structure 45 is fabricated on the CMOS substrate 40. After the top metal layer (e.g., AlCu) is patterned and processed, conductive pads are formed in the top metal layer 48. The conductive pads in the top metal layer 48 can provide various electrical connections with various electrical components in the CMOS structure 45. Even through only the top metal layer is shown in FIG. 6A, the CMOS structure 45 generally can include multiple conductive layers to provide more complicated connections between various electrical components. In some embodiments, as shown in FIG. 6B, after the CMOS structure 45 is fabricated, the CMOS substrate 40 for supporting the CMOS structure 45 can be thinned down to the thickness as designed, which can be in a range from 150 um to 300 um.

At 320, the cap structure is fabricated. An example of the cap structure fabricated at 320 is the device structure as shown in FIG. 6C. In one embodiment, as shown in FIG. 6C, a layer of oxide 60 is formed on a first side of the cap wafer 70, and the first side of the cap wafer 70 is etched to form one or more cavities 75. In some embodiments, this layer of oxide 60 can be formed by way of a thermal process. In other embodiments, this layer of oxide 60 can be formed by a deposition process, such as, chemical vapor deposition (CVD) or atomic layer deposition (ALD).

Next, at 330, the MEMS wafer is bonded to the cap structure. In one embodiment, as shown in FIG. 6D, the MEMS wafer 50 (e.g., a silicon substrate) is bonded to the cap structure 80 of FIG. 6C. In some embodiments, the device structure in FIG. 6D is also subjected to post bonding annealing. After the MEMS wafer 50 is bonded to the cap wafer 70, in some embodiments, as shown in FIG. 6E, one or both of the MEMS wafer 50 and the cap wafer 70 can be thinned down to the thickness as designed. For example, the MEMS wafer 50 can be in a range from 50 um to 250 um, and the Cap wafer 70 can be in a range from 150 um to 300 um.

Next, at 340, the silicon plug is formed, and this silicon plug extends at least through the MEMS wafer. In one embodiment, as shown in FIG. 6F, the silicon plug 56 passes through the MEMS wafer 50 and extends partially into the layer of oxide 60. For forming the silicon plug 56 in in FIG. 6F, the MEMS wafer 50 is etched according to a patterned mask to form the opening-hole extending into the MEMS wafer 50; when the etching stops at the layer of oxide 60, the opening-hole created extends to the interface between the MEMS wafer 50 and the layer of oxide 60. In some embodiments, with extra over etching, the opening-hole created by the etching can pass through the MEMS wafer 50 and extend at least partially into the layer of oxide 60. When conductive material (e.g., polysilicon) is deposited towards the surface of the MEMS wafer 50 with the opening-hole, to fill the opening-hole with the deposited conductive material (e.g., polysilicon), the silicon plug 56 is formed. After the process of conductive material deposition, the surface of the MEMS wafer 50 is subject to a polish process, such as chemical mechanical polishing (CMP) process, for planarization and for removing the excess conductive material on the surface of the MEMS wafer 50.

In the embodiment as shown in FIG. 6F, the silicon plug 56 passes through the MEMS wafer 50 and extends partially into the layer of oxide 60. In some other embodiments, the silicon plug 56 can be formed to pass through both the MEMS wafer 50 and the layer of oxide 60, and the formed silicon plug 56 can also extends partially into the cap wafer 70. Additionally, other designs of the silicon plug 56 are also possible, and some examples of these other designs are shown in FIGS. 6F(1)-6F(5), which are described in more details later in the disclosure.

Next, at 350, bonding-pad patterns are formed. In one embodiment, as shown in FIG. 6G, after a layer of germanium is deposited on the MEMS wafer 50, this layer of germanium is then patterned to form the bonding-pad 59.

Next, at 360, the MEMS structure is formed in the MEMS wafer. In one embodiment, as shown in FIG. 6H, the MEMS wafer 50 is etched to form the MEMS structure 55.

Next, at 370, the MEMS wafer on the cap wafer is bonded to the CMOS substrate with eutectic bond. In one embodiment, as shown in FIG. 6I, the MEMS wafer 50 on the cap wafer 70 as shown in the device structure of FIG. 6H is bonded to the CMOS substrate as shown in the device structure of FIG. 6B. A eutectic bond is formed between the bonding-pad 59 on the MEMS wafer 50 and the conductive pads in the top metal layer 48 on the CMOS structure 45.

Next, at 800, conductive paths on the cap structure are conductively connected with their corresponding pads on the CMOS structure. The step 800 of the method 300 is shown in the flowchart of FIG. 2D, which includes blocks 810, 820, 830, 840, and 850.

At 810, the second side of the cap wafer is etched to form trenches. In one embodiment, as shown in FIG. 6J, trenches 76 are formed in the second side of the cap wafer 70. To form the trenches 76, the cap wafer is etched with deep reactive-ion etching, and after this etching stops at the oxide layer 60, oxide etching process is to remove part of the oxide layer 60 until the oxide etching process stops at the polysilicon of the silicon plug 56. One of the trenches 76 as shown in FIG. 6J has a height "h", a bottom width "b", and a sidewall angle "θ". The height "h" can be in a range from 200 um to 400 um; the bottom width "b" can be in a range from 30 um to 100 um; and the sidewall angle "θ" can be in a range from 60 degrees to 85 degrees. In some embodiments, the size of the bottom width "b" depends on ASIC requirement.

Next, at 820, isolation material is deposited onto the second side of the cap wafer and the surfaces of the trenches. In one embodiment, as shown in FIG. 6K, a layer of isolation oxide 82 is deposited onto the second side of the cap wafer 70 and the surfaces of the trenches 76. The layer of isolation oxide 82 can be in a range from 500 nm to 1000 nm.

Next, at 830, an opening is formed at the bottom of the trench. In one embodiment, as shown in FIG. 6L, an opening 62 is formed at the bottom of the trench 76 with an etching process. The etching process removes parts of the isolation oxide 82 and the oxide 60 to form the opening 62.

Next, at 840, conductive material is deposited towards the second side of the cap wafer and the trenches. In one embodiment, as shown in FIG. 6M, when conductive material (e.g., AlCu) is deposited towards the second side of the cap wafer 70 and the trenches 76, a layer of the conductive material (e.g., AlCu) is formed on the second side of the cap wafer 70 and the sidewalls of the trench 76, forming in the trench 76 the conductive contact 85 that is connected to the silicon plug 56. The layer of the conductive material (e.g., AlCu) can be in a range from 500 nm to 1500 nm.

In some embodiments, as shown in FIG. 6N, the layer of the conductive material for forming the conductive contact 85 also serves as the conductive routing layer 86. When the conductive routing layer 86 is patterned to form conductive paths on the cap wafer 70, the conductive contact 85 can be implemented to connect the conducting pad 58 with one or more conductive paths on the cap wafer 70. In some embodiments, conductive paths on the cap wafer 70 can be formed separately in another conductive layer that is different from the layer of the conductive material for forming the conductive contact 85, and the conductive contact 85 can still be implemented to connect the conducting pad 58 with one or more conductive paths formed in this other conductive layer on the cap wafer 70.

Next, at 850, the passivation layer is formed on top of the second side of the cap wafer, and the passivation layer is patterned to form openings for the connection pads. In one embodiment, as shown in FIG. 6N, the passivation layer 88 is formed on top of the second side of the cap wafer 70 by depositing a layer of oxide and a layer of silicon nitride. The layer of oxide can be in a range from 500 nm to 1000 nm. The layer of silicon nitride can be in a range from 500 nm to 1000 nm. In FIG. 6N, openings 87 can be formed in the passivation layer 88 by patterning and removing some parts of the layer of oxide and the layer of silicon nitride. The openings 87 can expose the connection pads for connecting the integrated CMOS-MEMS device 30 with other external electronic elements, such as, the electronic circuits on a PC board. In some embodiments, as shown in FIG. 6N, the connection pads at the openings 87 can be connected to other electronic elements through metal balls 95 (e.g. Sn). A PC board 90, positioned in parallel with the cap structure, can be connected to the integrated CMOS-MEMS device 30 through the metal balls 95.

In addition to the particular design of the silicon plug 56 in FIG. 6F, there are other designs of the silicon plug 56. FIGS. 6F(1)-6F(5) depict several designs of the silicon plug 56 in accordance with some embodiments. FIG. 6F(1) shows the silicon plug 56 of FIG. 6F in both a top view and a cross-section view. The silicon plug 56 in FIG. 6F(1) is in the form of a single rod. FIG. 6F(2) shows another design of the silicon plug 56 in both a top view and a cross-section view. The silicon plug 56 in FIG. 6F(2) is in the form of multiple rods. FIG. 6F(3), FIG. 6F(4), and FIG. 6F(5) depict three other designs of the silicon plug 56 each in a top view. The top view of the silicon plug 56 in FIG. 6F(3) is in the form of multiple circular rings, the top view of the silicon plug 56 in FIG. 6F(4) is in the form of multiple rectangular rings, the top view of the silicon plug 56 in FIG. 6F(5) is in the form of multiple hexagon rings. In addition to the designs of the silicon plug 56 as disclosed explicitly in the above, people skilled in the art may find other designs of the silicon plug 56.

Figure 7:
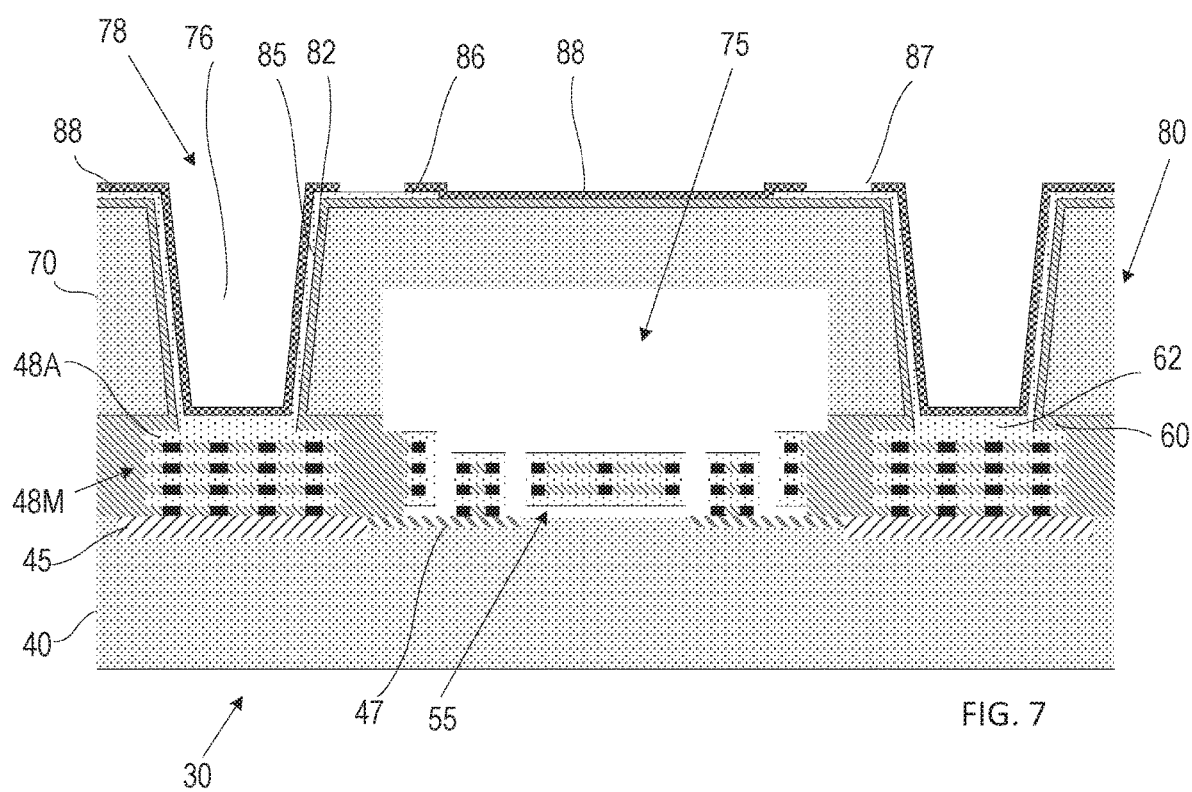
FIG. 7 is a cross-section view of a CMOS-MEMS device that has a through-chip via for connecting a conducting layer on a cap structure with a conducting layer in a CMOS structure in accordance with some embodiments.

FIG. 7 is a cross-section view of a CMOS-MEMS device that has a through-chip via for connecting a conducting layer on a cap structure with a conducting layer in a CMOS structure in accordance with some embodiments. In FIG. 7, the integrated CMOS-MEMS device 30 includes a CMOS structure 45 that is fabricated on a CMOS substrate 40. The CMOS structure 45 includes some CMOS devices and multiple conductive layers 48M. The integrated CMOS-MEMS device 30 also includes a MEMS structure 55 and a cap structure 80. An isolation layer 60 deposited is on a first side of the cap structure 80, and a conductive routing layer 86 is deposited on a second side of the cap structure 80. The MEMS structure 55, which includes at least one MEMS device, is deposited between the CMOS substrate 40 and the cap structure. One or more vias 78 passes through the cap structure 80. Any one of the vias 78 can be a through-chip via that passes through the cap wafer of the cap structure 80. When the cap structure 80 is fabricated with a silicon wafer, any one of the vias 78 can be a through-silicon via ("TSV").

In FIG. 7, both the MEMS structure 55 and the CMOS structure 45 are fabricated on the first substrate 40. A conductive contact 85, after passing through one of the vias 78 and through the opening 62 in the isolation layer 60 on the cap structure 80, is conductively connected to one of the pad 48A in the top conducting layer of the CMOS structure 45.

Figure 8A:
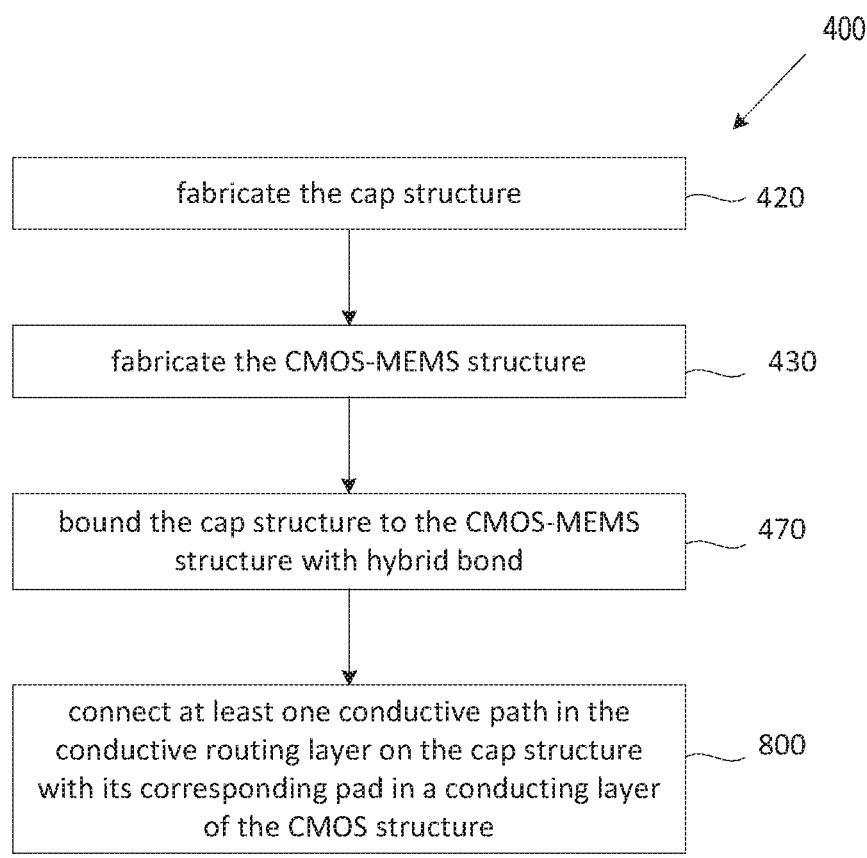
FIGS. 8A-8B are flow charts showing a method of fabricating an integrated CMOS-MEMS device that has through-chip vias for electrically connecting CMOS structures with other devices in accordance with some embodiments.
Figure 8B:
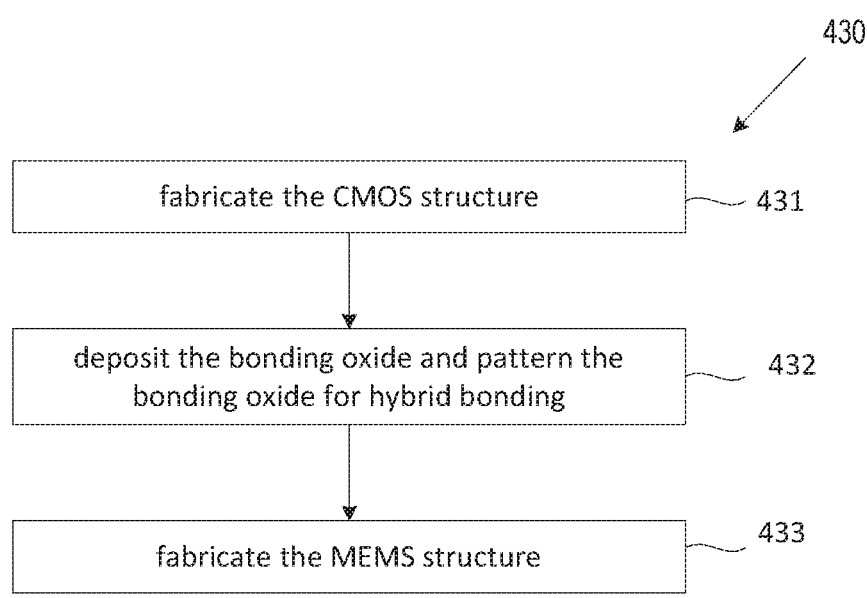

FIGS. 8A-8B are flow charts showing a method 400 of fabricating an integrated CMOS-MEMS device that has through-chip vias for electrically connecting CMOS structures with other devices in accordance with some embodiments. An example of the device fabricated with this method is the integrated CMOS-MEMS device 30 as shown in FIG. 7. FIGS. 9A-9J are cross-section views of device structures for showing a method of fabricating an integrated CMOS-MEMS device 30 in accordance with some embodiments.

Figure 9A:
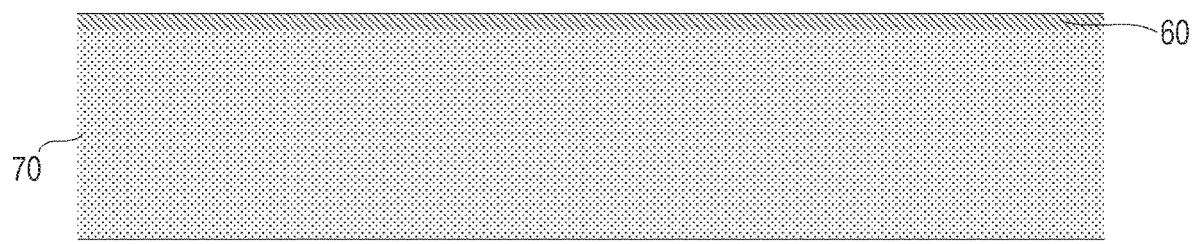
FIGS. 9A-9J are cross-section views of device structures for showing a method of fabricating an integrated CMOS-MEMS device in accordance with some embodiments.
Figure 9B:
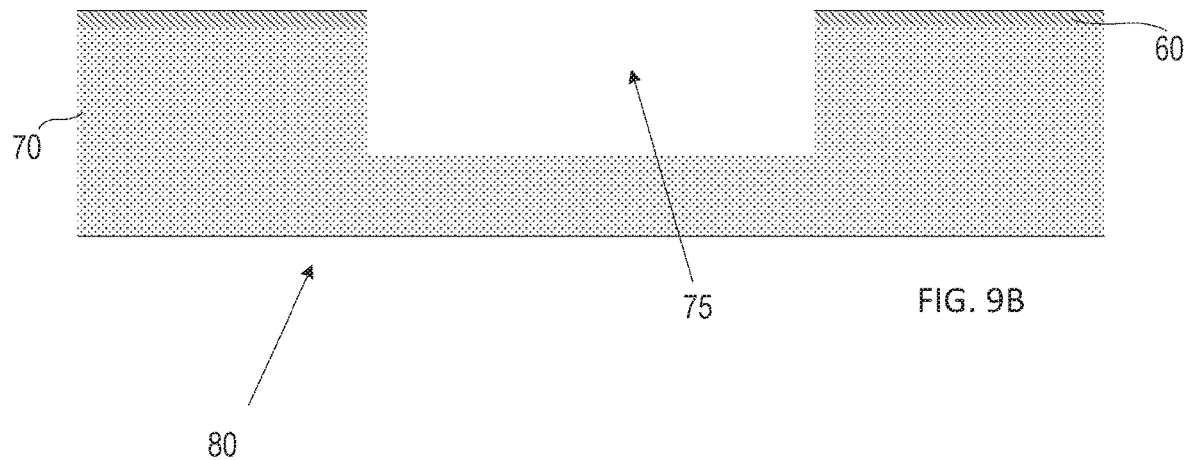

In the method 400 as shown in FIG. 8A, at 420, the cap structure is fabricated. An example of the cap structure fabricated at 410 is the device structure as shown in FIG. 9B. To fabricate this cap structure, as shown in FIG. 9A, a layer of oxide 60 is deposited on a first side of the cap wafer 70 and subject to a CMP process for planarization; then, as shown in FIG. 9B, the first side of the cap wafer 70 is etched to form one or more cavities 75.

Figure 9C:
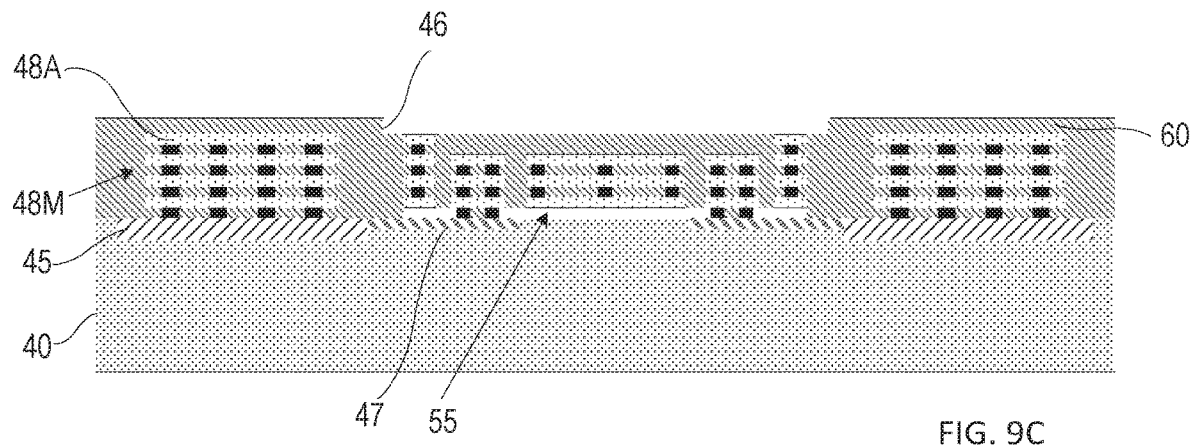
Figure 9D:
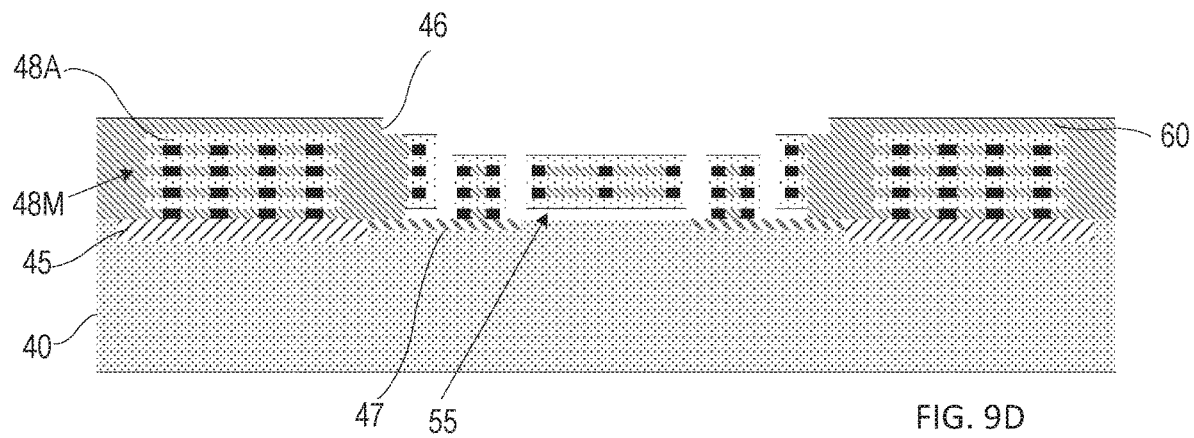

Next, at 430, the CMOS-MEMS structure is fabricated. An example of the CMOS-MEMS structure fabricated at 430 is the device structure as shown in FIG. 9D. FIG. 8B is a flowchart showing the step 430 in the method 400 of FIG. 8A. In FIG. 8B, at 431, the CMOS structure is fabricated; at 432, the bonding oxide is deposited, and this bonding oxide is patterned for hybrid bonding; and at 433, the MEMS structure is fabricated with post-CMOS process. In one embodiment, as shown in FIG. 9C, the CMOS structure 45 is fabricated on the CMOS substrate 40. After the top metal layer (e.g., AlCu) is patterned and processed, conductive pads 48A are formed in the top metal layer. The conductive pads in the top metal layer 48 can provide various electrical connections between various electrical components in the CMOS structure 45. The CMOS structure 45 generally can include multiple conductive layers 48M to provide more complicated connections between various electrical components. In FIG. 9C, bonding oxide 46 is deposited and patterned for hybrid bonding. Then, as shown in FIG. 9D, the MEMS structure 55 is fabricated with post-CMOS process. In some embodiments, connection 47 can provide electrical connections between the MEMS structure 55 and the CMOS structure 45.

Figure 9E:
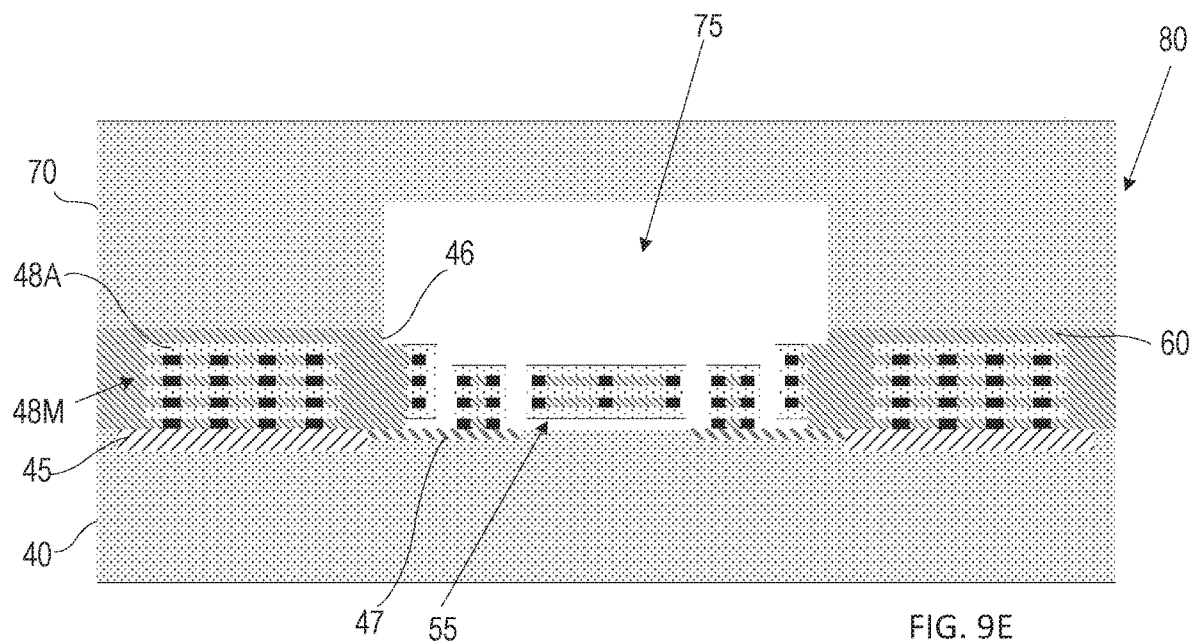

Next, at 470, the cap structure is bonded to the CMOS-MEMS structure with hybrid bonding. In one embodiment, as shown in FIG. 9E, the cap structure 80 of FIG. 9B is bonded with the CMOS-MEMS structure of FIG. 9D with hybrid bonding when the layer of oxide 60 on the first side of the cap wafer 70 is jointed with the bonding oxide 46 on the CMOS-MEMS structure.

Next, at 800, conductive paths on the cap structure are conductively connected with their corresponding pads on the CMOS structure. The step 800 of the method 400 is shown in the flowchart of FIG. 2D, which includes blocks 810, 820, 830, 840, and 850.

Figure 9F:
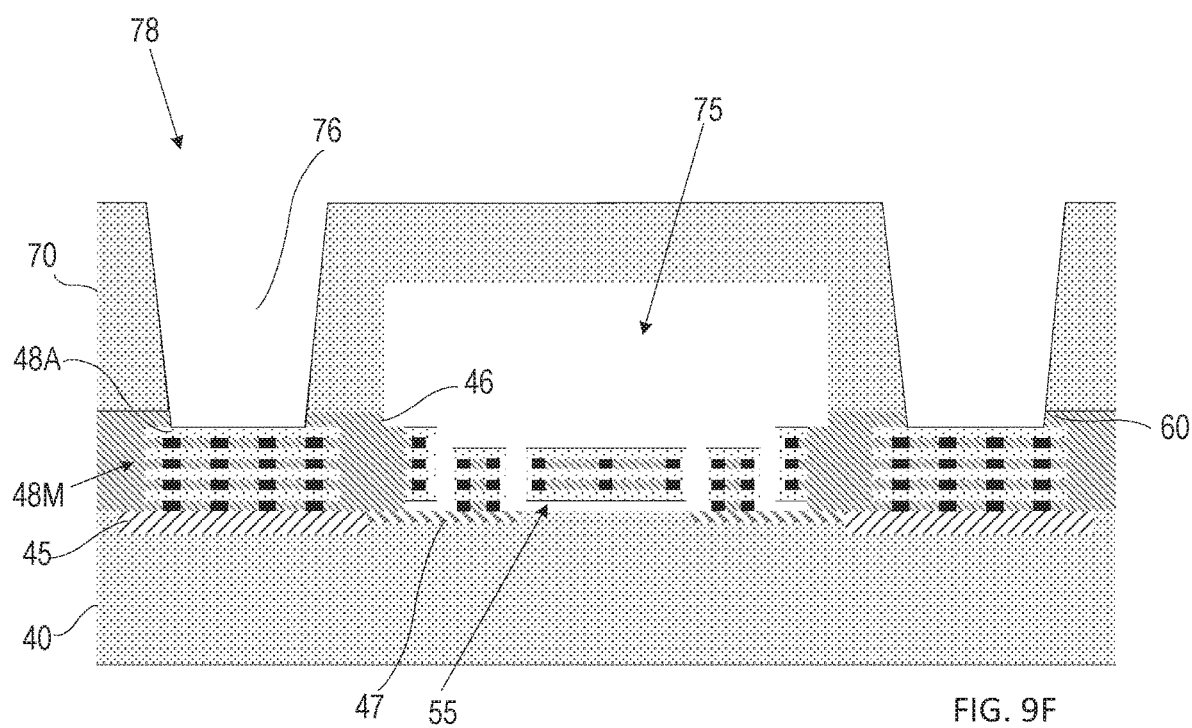

At 810, the second side of the cap wafer is etched to form trenches. In one embodiment, as shown in FIG. 9F, trenches 76 are formed in the second side of the cap wafer 70. To form the trenches 76, the cap wafer is etched with deep reactive-ion etching, and after this etching stops at the oxide layer 60, oxide etching process is to remove part of the oxide layer 60 and the bonding oxide 46 until the oxide etching process stops at the top conducting layer 48 of the CMOS structure 45

Figure 9G:
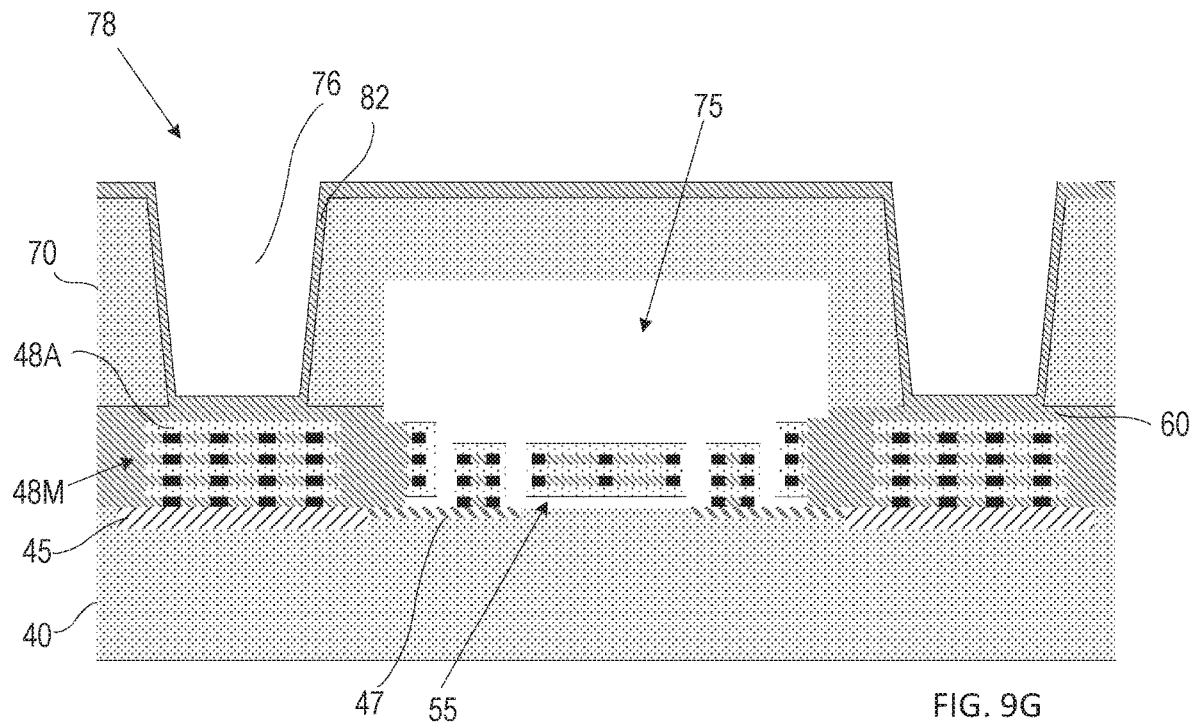

Next, at 820, isolation material is deposited onto the second side of the cap wafer and the surfaces of the trenches. In one embodiment, as shown in FIG. 9G, a layer of isolation oxide 82 is deposited onto the second side of the cap wafer 70 and the surfaces of the trenches 76. The layer of isolation oxide 82 can be in a range from 500 nm to 1000 nm.

Figure 9H:
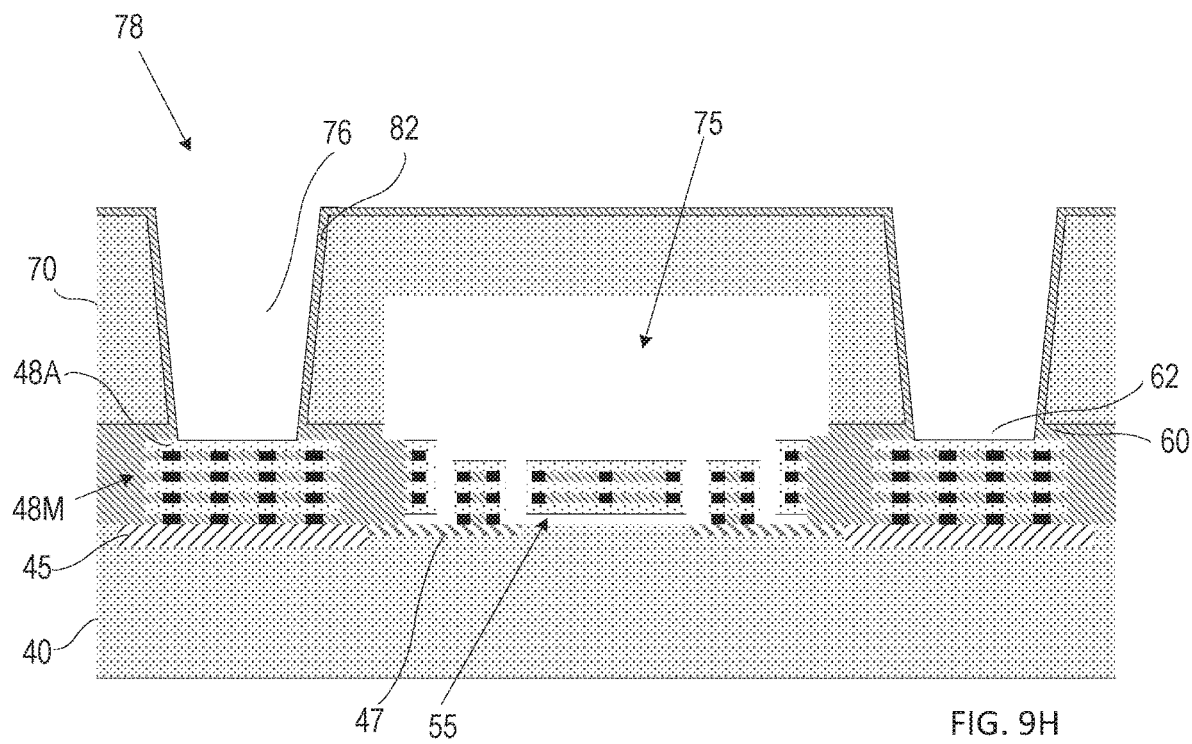

Next, at 830, an opening is formed at the bottom of the trench. In one embodiment, as shown in FIG. 9H, an opening 62 is formed at the bottom of the trench 76 with an etching process. The etching process removes parts of the isolation oxide 82, the oxide 60, and the bonding oxide 46 to form the opening 62.

Figure 9I:
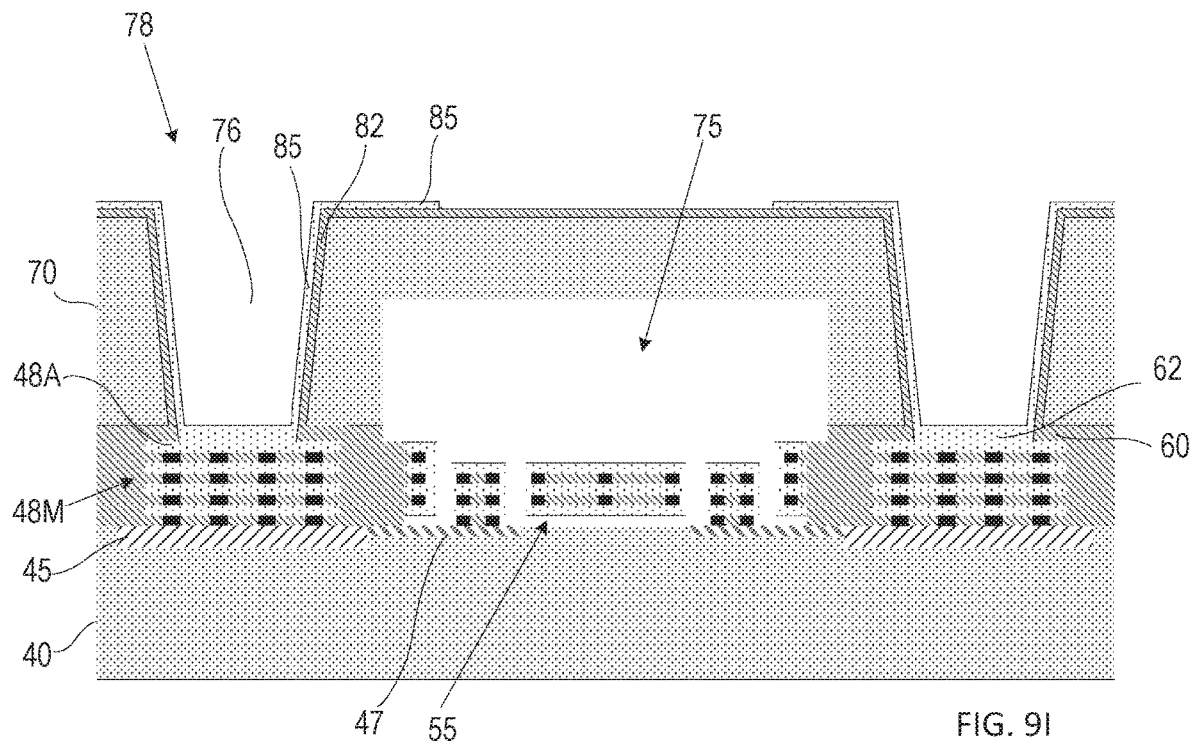

Next, at 840, conductive material is deposited towards the second side of the cap wafer and the trenches. In one embodiment, as shown in FIG. 9I, when conductive material (e.g., AlCu) is deposited towards the second side of the cap wafer 70 and the trenches 76, a layer of the conductive material (e.g., AlCu) is formed on the second side of the cap wafer 70 and the sidewalls of the trench 76, forming in the trench 76 the conductive contact 85 that is connected to the conductive pad at the top conducting layer 48 of the CMOS structure 45. The layer of the conductive material (e.g., AlCu) can be in a range from 500 nm to 1500 nm.

Figure 9J:
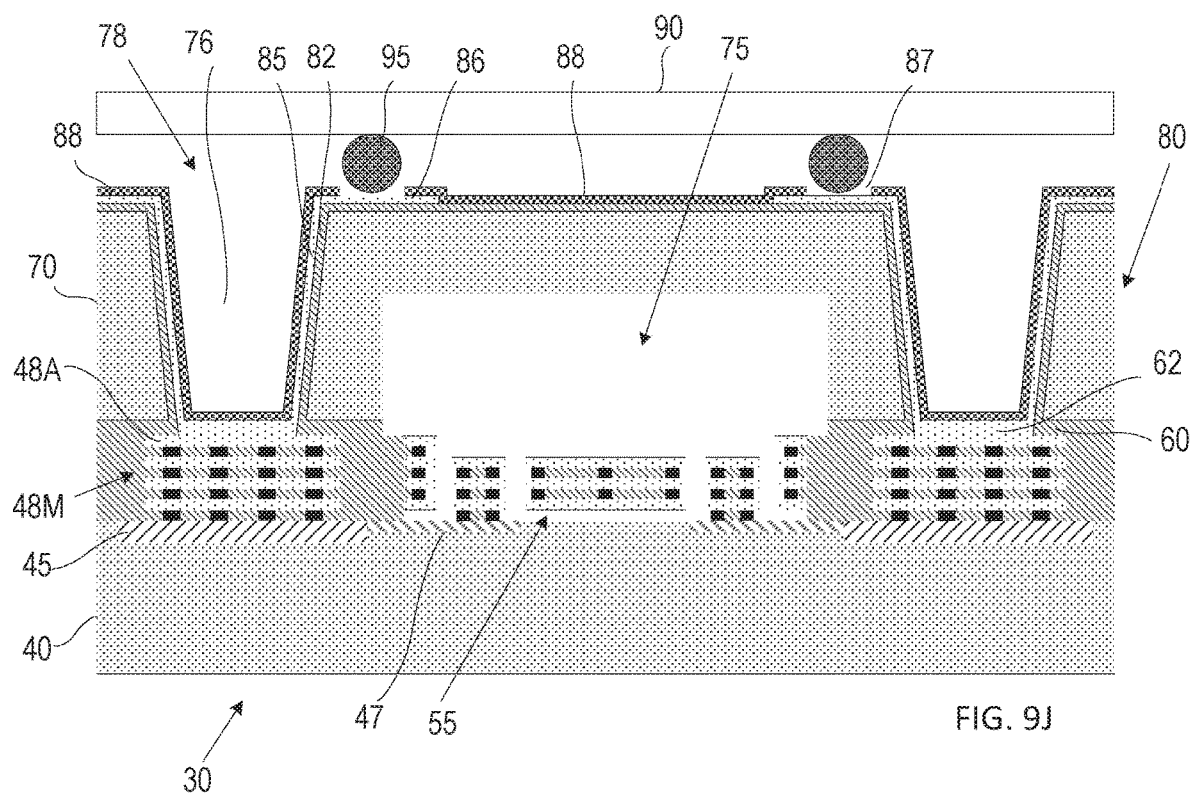

Next, at 850, the passivation layer is formed on top of the second side of the cap wafer, and the passivation layer is patterned to form openings for the connection pads. In one embodiment, as shown in FIG. 9J, the passivation layer 88 is formed on top of the second side of the cap wafer 70 by depositing a layer of oxide and a layer of silicon nitride. The layer of oxide can be in a range from 500 nm to 1000 nm. The layer of silicon nitride can be in a range from 500 nm to 1000 nm. In FIG. 9J, openings 87 can be formed in the passivation layer 88 by patterning and removing some parts of the layer of oxide and the layer of silicon nitride. The openings 87 can expose the connection pads for connecting the integrated CMOS-MEMS device 30 with other external electronic elements, such as, the electronic circuits on a PC board. In some embodiments, as shown in FIG. 9J, the connection pads at the openings 87 can be connected to other electronic elements through metal balls 95 (e.g. Sn). A PC board 90, positioned in parallel with the cap structure, can be connected to the integrated CMOS-MEMS device 30 through the metal balls 95.

Figure 10:
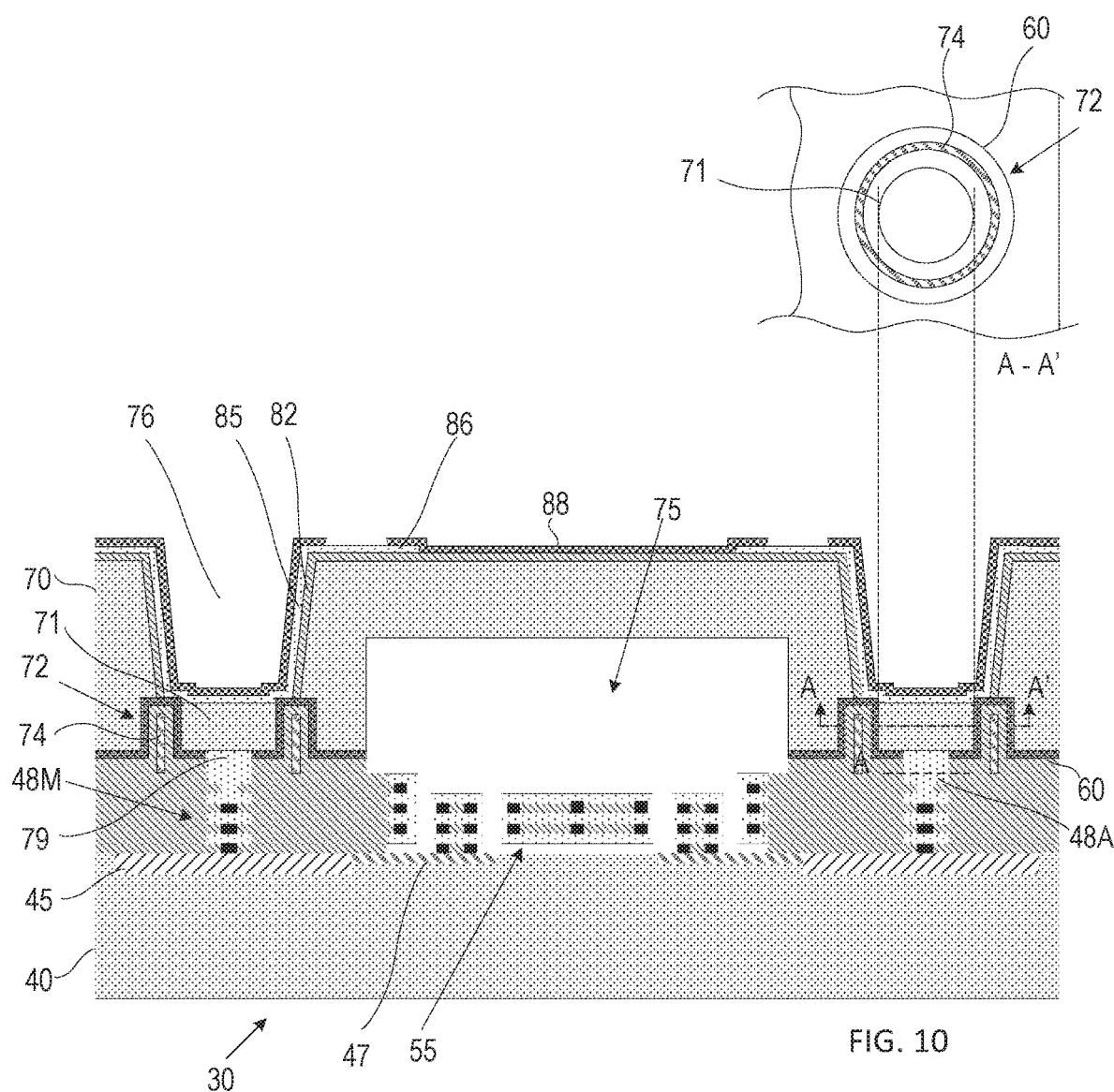
FIG. 10 is a cross-section view of another CMOS-MEMS device that has a through-chip via for connecting a conducting layer on a cap structure with a conducting layer in a CMOS structure in accordance with some embodiments.

FIG. 10 is a cross-section view of another CMOS-MEMS device that has a through-chip via for connecting a conducting layer on a cap structure with a conducting layer in a CMOS structure in accordance with some embodiments. In FIG. 10, the integrated CMOS-MEMS device 30 includes a CMOS structure 45 that is fabricated on a CMOS substrate 40. The CMOS structure 45 includes some CMOS devices and multiple conductive layers 48M. The integrated CMOS-MEMS device 30 also includes a MEMS structure 55 and a cap structure 80. An isolation layer 60 deposited is on a first side of the cap structure 80, and a conductive routing layer 86 is deposited on a second side of the cap structure 80. The MEMS structure 55, which includes at least one MEMS device, is located between the CMOS substrate 40 and the cap structure 80. One or more vias 78 passes through the cap structure 80. Any one of the vias 78 can be a through-chip via that passes through the cap wafer of the cap structure 80. When the cap structure 80 is fabricated with a silicon wafer, any one of the vias 78 can be a through-silicon via ("TSV").

In FIG. 10, both the MEMS structure 55 and the CMOS structure 45 are fabricated on the first substrate 40. A silicon pillar 71 is fabricated in the cap structure 80 and surrounded by a trench ring 72 on the first side of the cap structure 80. The silicon pillar 71 is conductively connected to one of the pad 48A in the top conducting layer of the CMOS structure 45. A conductive contact 85, after passing through one of the vias 78 and through the opening 62 in the isolation layer 60 on the cap structure 80, conductively connecting one or more conductive paths in the conductive routing layer 86 with the silicon pillar 71. Consequently, because the silicon pillar 71 is conductive, a conductive path in the conductive routing layer 86 can be conductively connected to one of the pad 48A in the top conducting layer of the CMOS structure 45. The insert in FIG. 10 shows a top view of a cut out section of the cap wafer 70 viewed at the viewing plane A-A', which illustrates the top views of the silicon pillar 71, and the trench ring 72 filled with oxide 60 and polysilicon 74.

Figure 11A:
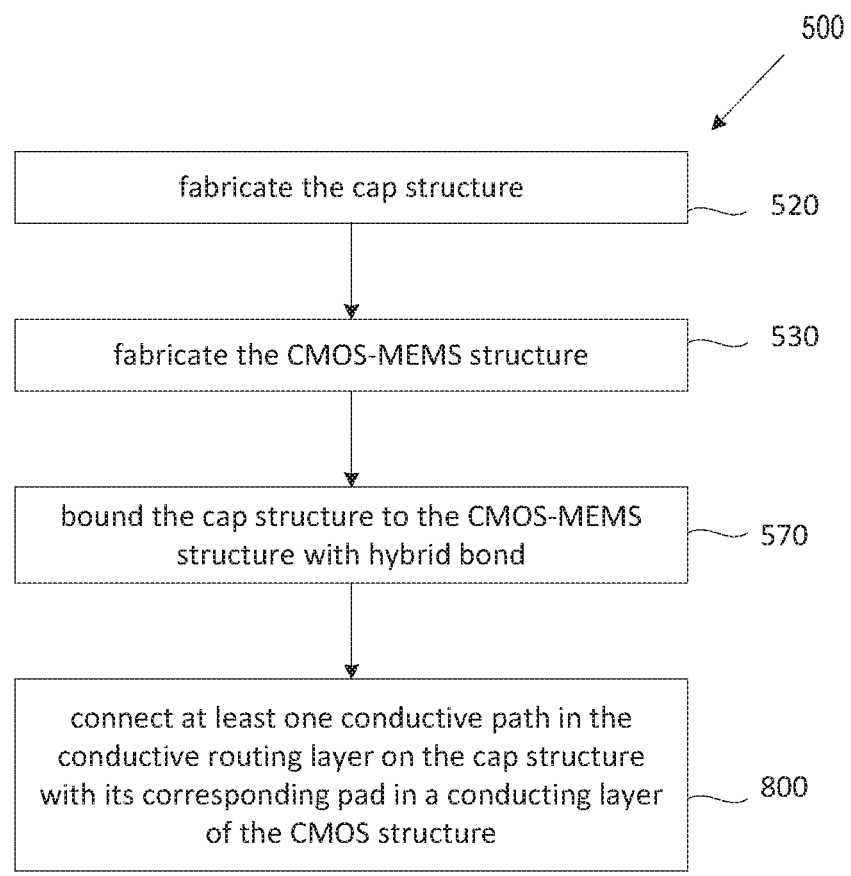
FIGS. 11A-11B are flow charts showing a method of fabricating an integrated CMOS-MEMS device that has through-chip vias for electrically connecting CMOS structures with other devices in accordance with some embodiments.
Figure 11B:
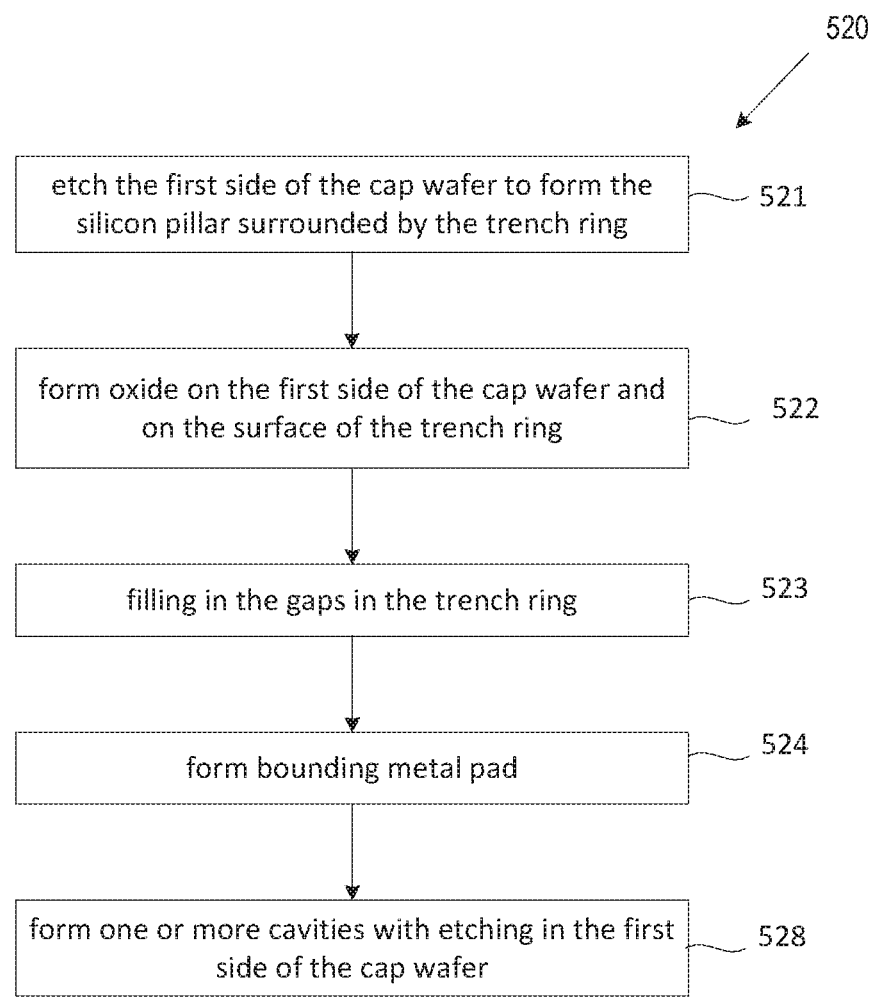

FIGS. 11A-11B are flow charts showing a method 500 of fabricating an integrated CMOS-MEMS device that has through-chip vias for electrically connecting CMOS structures with other devices in accordance with some embodiments. An example of the device fabricated with this method is the integrated CMOS-MEMS device 30 as shown in FIG. 10. FIGS. 12A-12L are cross-section views of device structures for showing a method of fabricating an integrated CMOS-MEMS device 30 in accordance with some embodiments.

Figure 12A:
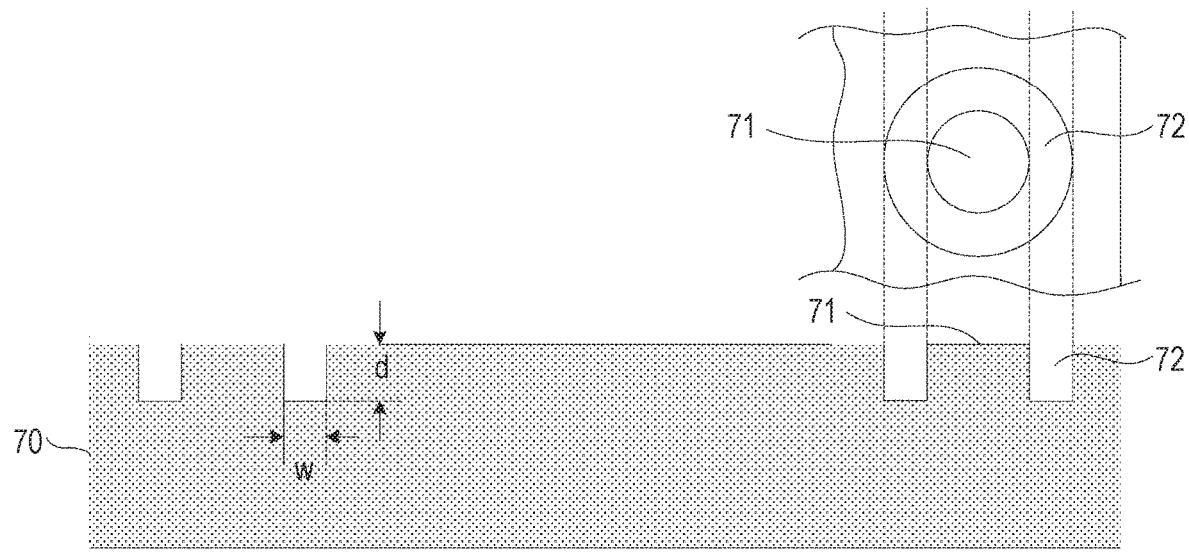
FIGS. 12A-12L are cross-section views of device structures for showing a method of fabricating an integrated CMOS-MEMS device in accordance with some embodiments.
Figure 12B:
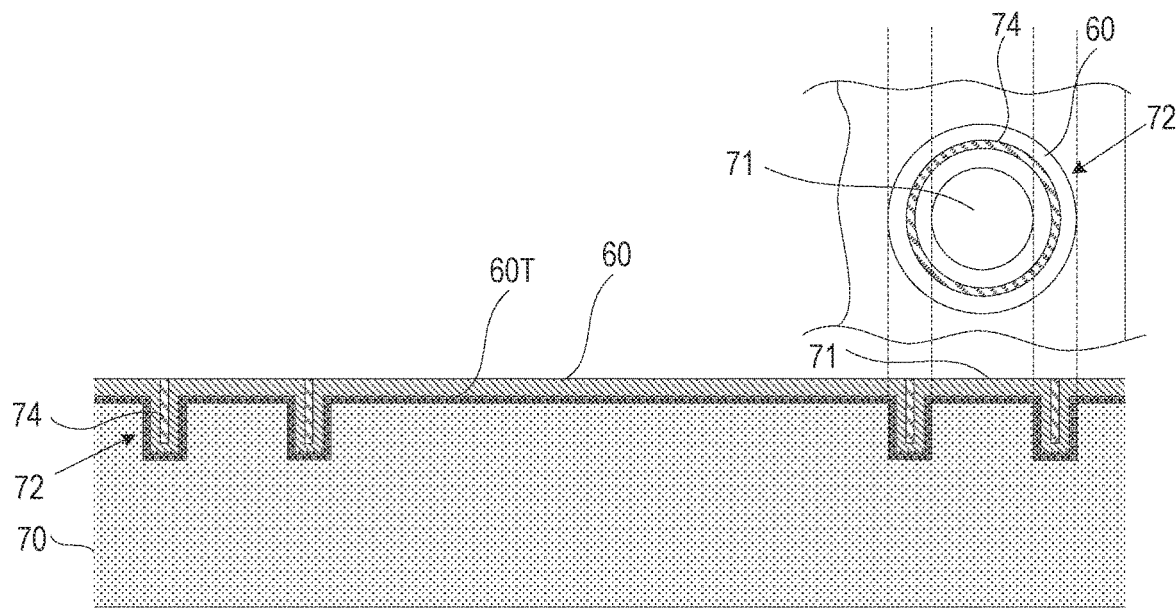
Figure 12C:
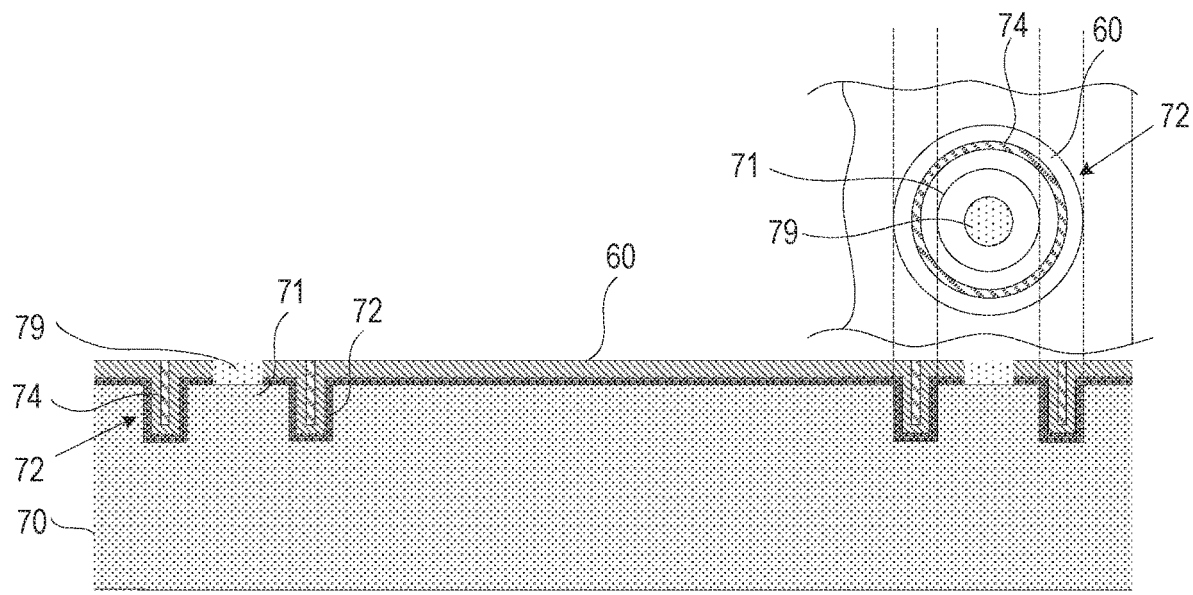
Figure 12D:
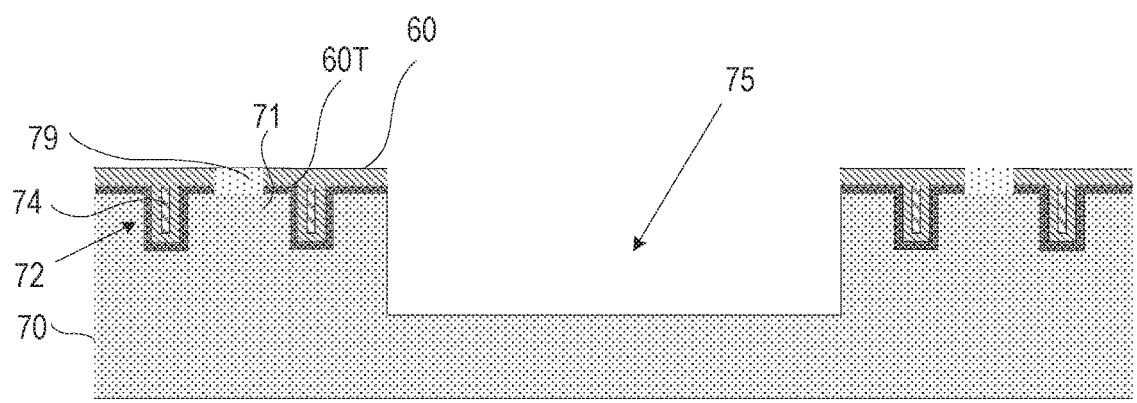

In the method 500 as shown in FIG. 11A, at 520, the cap structure is fabricated. An example of the cap structure fabricated at 520 is the device structure as shown in FIG. 12D. FIG. 11B is a flowchart showing the step 520 in the method 500 of FIG. 11A. The step 520 includes blocks 521, 522, 523, 524, and 528.

As shown in FIG. 11B, at 521, the first side of the cap wafer is etched to form the silicon pillar surrounded by the trench ring. In one embodiment, as shown in FIG. 12A, the first side of the cap wafer 70 is etched to form the silicon pillar 71 surrounded by a trench ring 72. The insert in FIG. 12A shows a top view of the silicon pillar 71 and the trench ring 72 in a cut out section of the cap wafer 70. The trench ring 72 has a width "w" and a depth "d". In an example embodiment, the width "w" is equal to or larger than 10 um, and the depth "d" is about 50 um, which corresponds to an aspect ratio of about 1:5. Generally, a larger trench width provides larger TSV etching tolerance.

Next, at 522, oxide is formed on the first side of the cap wafer and on the surface of the trench ring; at 523, the gaps in the trench ring are filled. In one embodiment, as shown in FIG. 12B, oxide is formed on the first side of the cap wafer 70 and on the surface of the trench ring 72; here, the oxide formed includes two layers of oxide: a first layer of oxide 60T formed by thermal oxidation of the cap wafer 70, and a second layer of oxide 60 formed by LPCVD deposition. After the formation of oxide on the surface of the trench ring 72, if there are unfiled gaps remaining in the trench ring 72, these gaps can be filled with other material, such as polysilicon. In one embodiment, as shown in FIG. 12B, after LPCVD deposition of the second layer of oxide 60, polysilicon are deposited towards the first side of the cap wafer and towards the trench ring 72, which results in the gaps in the trench ring 72 being filled up with polysilicon 74. After polysilicon deposition, silicon CMP process can be used to remove residual polysilicon on the first side of the cap wafer, followed by oxide CMP process for planarization. The insert in FIG. 12B shows a top view of the trench ring 72 that is filled with oxide 60 and polysilicon 74.

Next, at 524, metal pad for hybrid bonding is formed on a surface of the silicon pillar. In one embodiment, as shown in FIG. 12C, metal pad 79 for hybrid bonding is formed on a center part in the surface of the silicon pillar 71. The material for forming the metal pad 79 can be selected to be identical to the material for forming the corresponding pad 48A in the top conducting layer 48 of the CMOS structure 45 as shown in FIG. 10. In one embodiment, the pad 48A in the CMOS structure 45 is made of copper (Cu), and the metal pad 79 is also made of copper (Cu). During the fabrication process, oxide etching process is used to remove the oxide 60 and the oxide 60T in the areas intended for forming the metal pad 79; then, following the sputtering deposition of Titanium (Ti) and Titanium Nitride (TiN) buffer layer, a layer of copper (Cu) is sputtered towards the first side of the cap wafer 70. After these sputtering depositions, Cu CMP process and Ti CMP process are applied on the first side of the cap wafer 70 for planarization and removing residual Cu and Ti/TiN outside the areas for the metal pad 79, which results in the device structure of FIG. 12C. The insert in FIG. 12C shows a top view of a cut out section of the cap wafer 70, which illustrates the top views of the metal pad 79, the silicon pillar 71, and the trench ring 72 filled with oxide 60 and polysilicon 74.

Next, at 528, one or more cavities are formed with etching in the first side of the cap wafer. In one embodiment, as shown in FIG. 12D, the first side of the cap wafer 70 is etched to form one or more cavities 75.

Figure 12E:
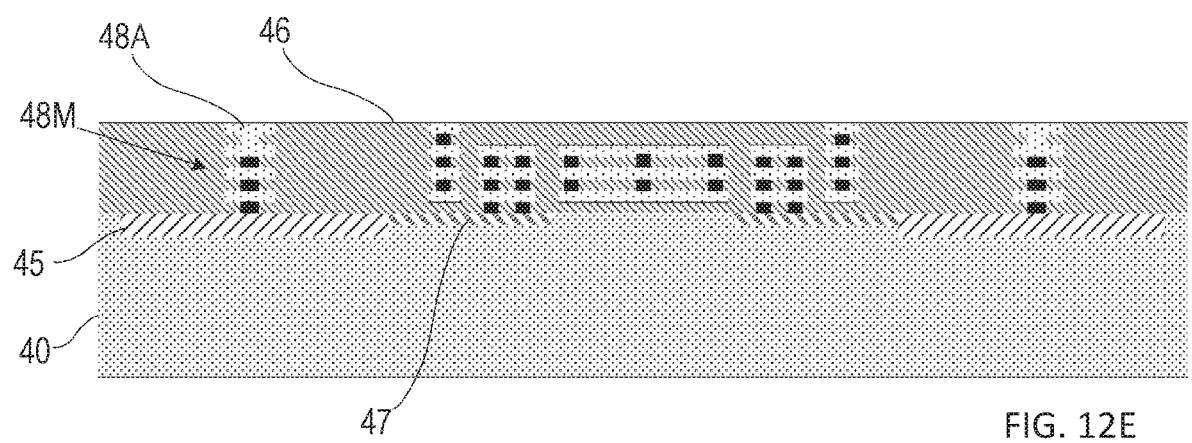
Figure 12F:
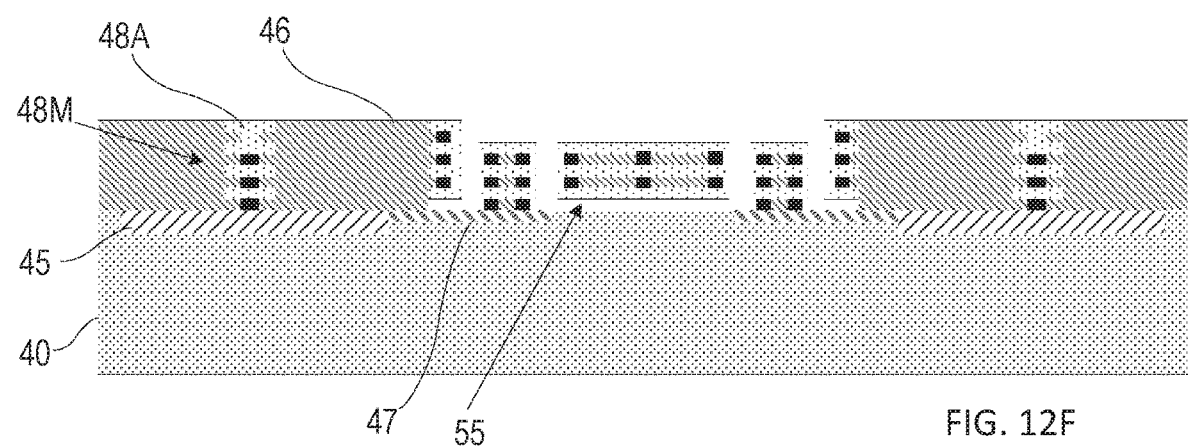

In the method 500 of FIG. 11A, at step 530 following the step 520, the CMOS-MEMS structure is fabricated. An example of the CMOS-MEMS structure fabricated at 530 is the device structure as shown in FIG. 12F. FIG. 11B is a flowchart showing the step 530 in the method 500 of FIG. 11A. In FIG. 11B, at 531, the CMOS structure is fabricate; at 532, the surface of the CMOS structure is prepared for hybrid bonding; and at 533, the MEMS structure is fabricated with post-CMOS process. In one embodiment, as shown in FIG. 12E, the CMOS structure 45 is fabricated on the CMOS substrate 40. After the top metal layer (e.g., AlCu) is patterned and processed, conductive pads 48A are formed in the top metal layer. The conductive pads 48A in the top metal layer 48 can provide various electrical connections to various electrical components in the CMOS structure 45. The CMOS structure 45 generally can include multiple conductive layers 48M to provide more complicated connections between various electrical components. In FIG. 12E, the conductive pads 48A form part of the surface of the CMOS-MEMS structure for hybrid bonding. For preparing the surface of the CMOS-MEMS structure for hybrid bonding, and if necessary, a layer of bonding oxide 46 can be deposited and patterned for hybrid bonding along with the conductive pads 48A on the surface of the CMOS-MEMS structure. Then, as shown in FIG. 12F, the MEMS structure 55 is fabricated with post-CMOS process. In some embodiments, connection 47 can provide electrical connections between the MEMS structure 55 and the CMOS structure 45.

Figure 12G:
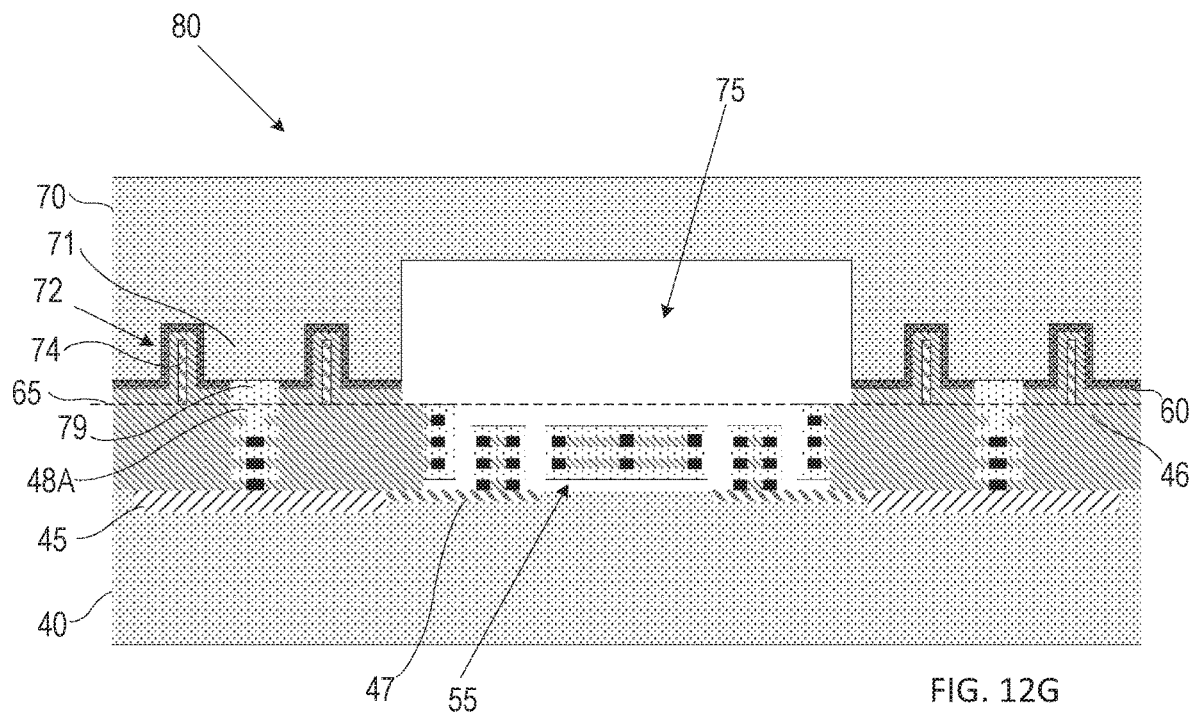

Next, at 570, the cap structure is bonded to the CMOS-MEMS structure with hybrid bonding. In one embodiment, as shown in FIG. 12G, the cap structure 80 of FIG. 12D is bonded to the CMOS-MEMS structure of FIG. 12F with hybrid bonding, when the layer of oxide 60 and the metal pad 79 (on the first side of the cap wafer 70) are respectively joined with the bonding oxide 46 and the conductive pads 48A (on the CMOS-MEMS structure). The hybrid bonding is located at the interface 65 between the cap structure 80 and the CMOS-MEMS structure. In some embodiments, when the material for the layer of oxide 60 (e.g., $SiO_2$) is identical to the material for the bonding oxide 46 (e.g., $SiO_2$) and the material for the metal pad 79 (e.g., Cu) is identical to the material for the conductive pads 48A (e.g., Cu), good hybrid bonding can be formed at the interface 65.

Next, at 800, conductive paths on the cap structure are conductively connected with their corresponding pads on the CMOS structure. The step 800 of the method 500 is shown in the flowchart of FIG. 2D, which includes blocks 810, 820, 830, 840, and 850.

Figure 12H:
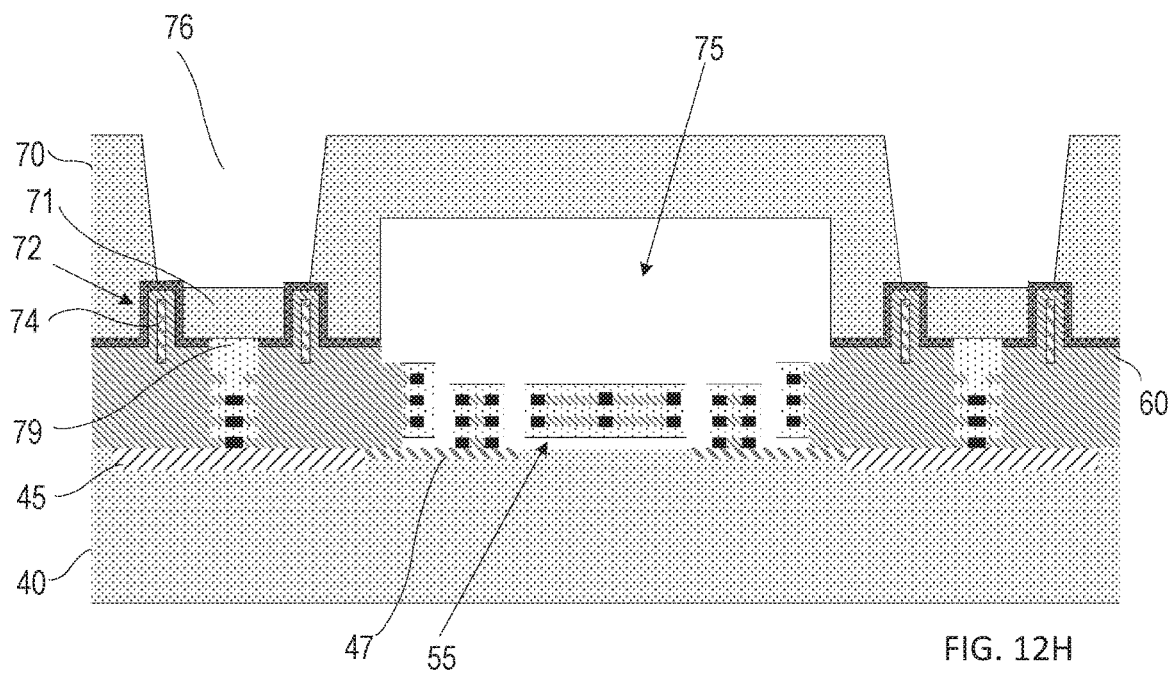

At 810, the second side of the cap wafer is etched to form trenches. In one embodiment, as shown in FIG. 12H, trenches 76 are formed in the second side of the cap wafer 70. In one embodiment, to form the trenches 76, the cap wafer 70 is etched with deep reactive-ion etching.

Figure 12I:
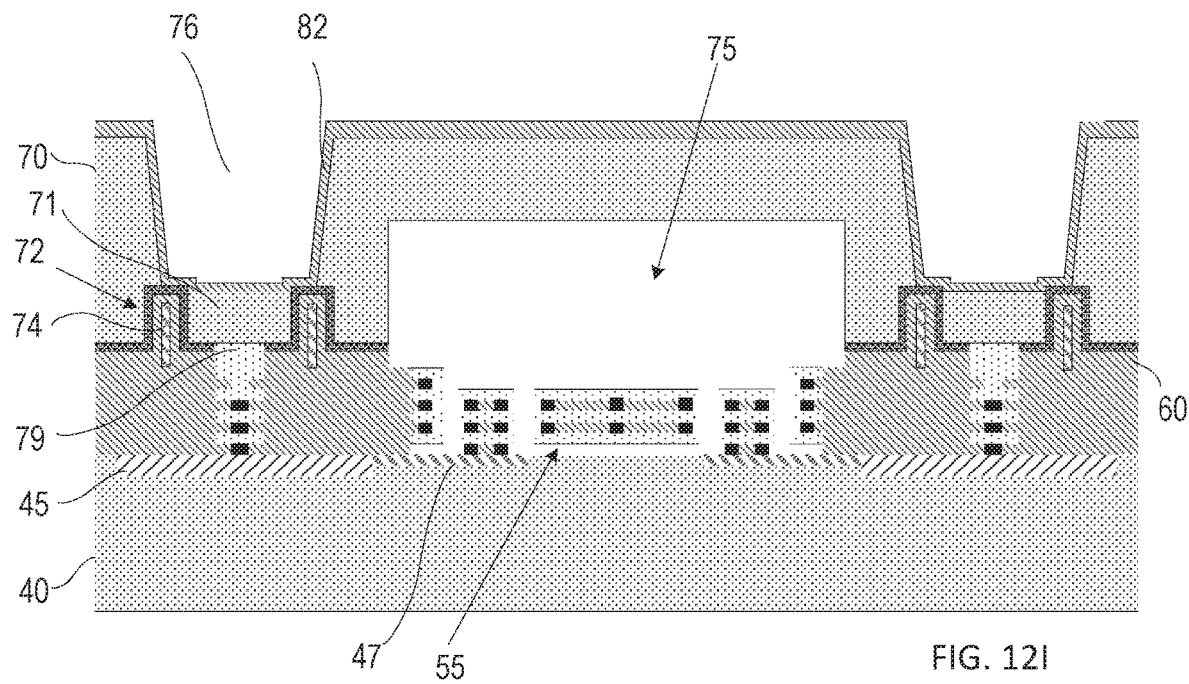

Next, at 820, isolation material is deposited onto the second side of the cap wafer and the surfaces of the trenches. In one embodiment, as shown in FIG. 12I, a layer of isolation oxide 82 is deposited onto the second side of the cap wafer 70 and the surfaces of the trenches 76. The layer of isolation oxide 82 can be in a range from 500 nm to 1000 nm.

Figure 12J:
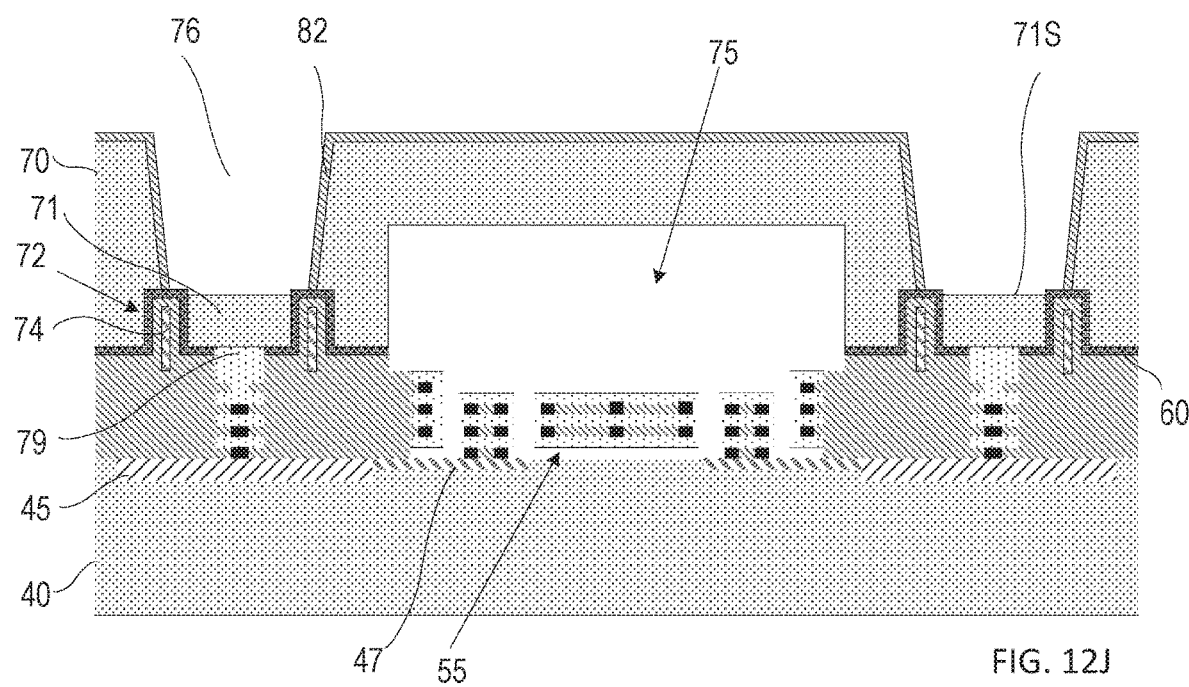

Next, at 830, an opening is formed at the bottom of the trench. In one embodiment, as shown in FIG. 12J, areas of the isolation oxide 82 at the bottom of the trench 76 are removed with an etching process to expose a surface 71S of the silicon pillar 71.

Figure 12K:
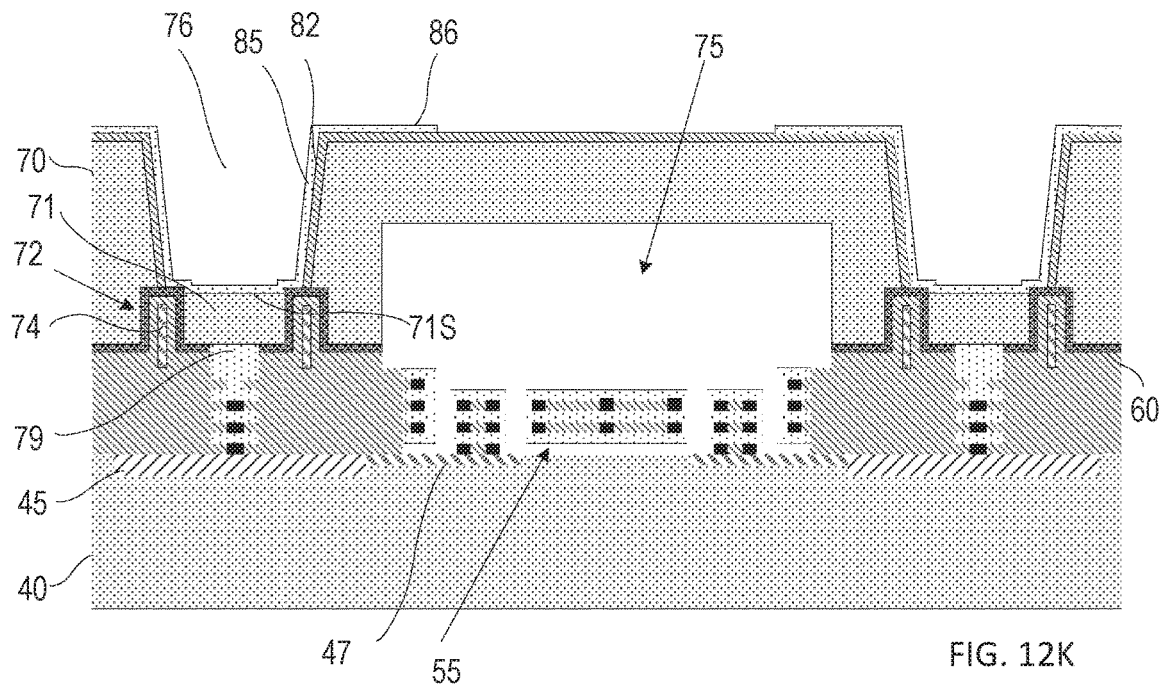

Next, at 840, conductive material is deposited towards the second side of the cap wafer and the trenches. In one embodiment, as shown in FIG. 12K, when conductive material (e.g., AlCu) is deposited towards the second side of the cap wafer 70 and the trenches 76, a layer of the conductive material (e.g., AlCu) is formed on the second side of the cap wafer 70 and the sidewalls of the trench 76, forming in the trench 76 the conductive contact 85 that is connected to the exposed surface 71S of the silicon pillar 71. The layer of the conductive material (e.g., AlCu) can be in a range from 500 nm to 1500 nm.

Figure 12L:
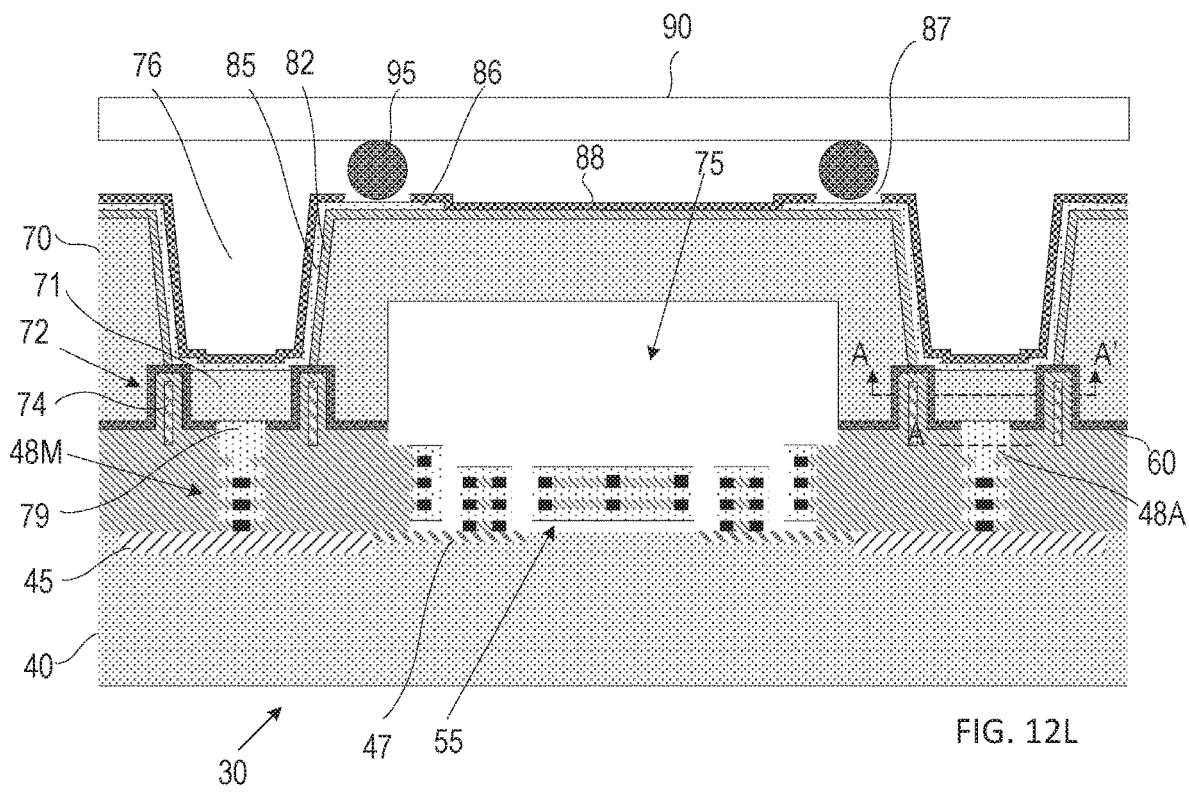

Next, at 850, the passivation layer is formed on top of the second side of the cap wafer, and the passivation layer patterned to form openings for the connection pads. In one embodiment, as shown in FIG. 12L, the passivation layer 88 is formed on top of the second side of the cap wafer 70 by depositing a layer of oxide and a layer of silicon nitride. The layer of oxide can be in a range from 500 nm to 1000 nm. The layer of silicon nitride can be in a range from 500 nm to 1000 nm. In FIG. 12L, openings 87 can be formed in the passivation layer 88 by patterning and removing some parts of the layer of oxide and the layer of silicon nitride. The openings 87 can expose the connection pads for connecting the integrated CMOS-MEMS device 30 with other external electronic elements, such as, the electronic circuits on a PC board. In some embodiments, as shown in FIG. 12L, the connection pads at the openings 87 can be connected to other electronic elements through metal balls 95 (e.g. Sn). A PC board 90, positioned in parallel with the cap structure, can be connected to the integrated CMOS-MEMS device 30 through the metal balls 95.

Some aspects of the present disclosure relate to an integrated CMOS-MEMS device. The integrated CMOS-MEMS device includes a CMOS structure, a cap structure, and a MEMS structure. The CMOS structure, fabricated on a first substrate, includes at least one CMOS device and at least one conducting layer. The cap structure, including vias passing through the cap structure, has an isolation layer deposited on its first side and has a conductive routing layer deposited on its second side. The MEMS structure, deposited between the first substrate and the cap structure, includes at least one MEMS device. The integrated CMOS-MEMS device also includes a conductive connector that passes through one of the vias and through an opening in the isolation layer on the cap structure. The conductive connector conductively connects a conductive path in the conductive routing layer on the cap structure with the at least one conducting layer of the CMOS structure.

Other aspects of the present disclosure relate to a method of fabricating an integrated CMOS-MEMS device. The method includes fabricating a CMOS-MEMS structure that includes a CMOS structure and a MEMS structure. The CMOS structure includes at least one CMOS device and at least one conducting layer. The method includes fabricating a cap structure by etching a first side of a cap wafer to form one or more cavities, with an isolation layer formed on the first side of the cap wafer. The method includes bonding the cap structure to the CMOS-MEMS structure, and etching one or more trenches at a second side of the cap wafer. The method further includes depositing conductive material towards the second side of the cap wafer and surfaces of the one or more trenches, to form a conductive contact that passes through one of the trenches at the second side of the cap wafer and conductively connects to the at least one conducting layer of the CMOS structure.

Other aspects of the present disclosure relate to a method of fabricating an integrated CMOS-MEMS device. The method includes fabricating, on a first substrate, a CMOS structure that includes at least one CMOS device and at least one conducting layer. The method includes fabricating a cap structure from a cap wafer, wherein the fabricating the cap structure includes etching a first side of the cap wafer to form one or more cavities, with an isolation layer deposited on the first side of the cap wafer. The method includes bonding the cap structure to a MEMS wafer, and forming at least one silicon plug extending at least through the MEMS wafer that has a first side thereof bonded to the isolation layer on the first side of the cap wafer. The method includes eutectic bonding the MEMS wafer to the first substrate, and etching one or more trenches at a second side of the cap wafer. The method further includes depositing conductive material towards the second side of the cap wafer and inner surfaces of the one or more trenches, to form a conductive contact that passes through one of the trenches at the second side of the cap wafer and conductively connected to the at least one silicon plug.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   fabricating, on a first substrate, a CMOS structure that includes at least one CMOS device and at least one conducting layer;
   fabricating a cap structure on a cap wafer, wherein the fabricating the cap structure includes etching a first side of the cap wafer to form one or more cavities, with an isolation layer deposited on the first side of the cap wafer;
   bonding the cap structure to a MEMS structure;
   forming at least one silicon plug surrounded by the isolation layer and in conductive contact with the at least one conducting layer;
   etching one or more trenches at a second side of the cap wafer; and
   depositing conductive material towards the second side of the cap wafer and inner surfaces of the one or more trenches, to form a conductive contact that passes through one of the trenches at the second side of the cap wafer and conductively connected to the at least one silicon plug.

2. The method of claim 1, comprising:
   fabricating, in the MEMS structure, at least one MEMS device.

3. A method comprising:
fabricating a CMOS structure on a first substrate, including at least one CMOS device and at least one conducting layer;
fabricating a cap structure by forming one or more cavities in a cap wafer;
fabricating a MEMS structure over the first substrate, including at least one MEMS device;
bonding the MEMS structure to the cap structure such that the one or more cavities are facing the MEMS device; and
forming a via in the cap structure, wherein the via extends to a silicon pillar that is directly over the at least one conducting layer of the CMOS structure, and wherein the via also extends over a top side of the cap structure, such that the via forms a conductive path from the top side of the cap structure to the at least one conducting layer of the CMOS structure through the silicon pillar.

4. The method of claim 3, wherein the via comprises a layer of aluminum copper (AlCu) alloy that has a thickness of 500 nm to 1500 nm covering inner surfaces of a trench in the top side of the cap structure.

5. The method of claim 3, wherein outer sidewalls of the via are surrounded by an isolating layer that extends across the top side of the cap structure past an outer perimeter of the via.

6. The method of claim 5, further comprising:
depositing a passivation layer over the via and the isolating layer, such that the passivation layer is in contact with both the via and the isolating layer.

7. The method of claim 3, further comprising:
forming an isolation layer on a first side of the cap wafer, wherein the one or more cavities are formed on the first side of the cap wafer after forming the isolation layer.

8. The method of claim 7, further comprising:
depositing the isolation layer within a ring shaped indent in the cap structure over an oxide layer, wherein the ring shaped indent surrounds the silicon pillar and has a greater height than the silicon pillar after the forming of the via.

9. The method of claim 7, further comprising:
forming a metal cap within the isolation layer; and
hybrid bonding the cap structure to the MEMS structure such that the metal cap is contacting and bonded to the at least one conducting layer of the CMOS structure.

10. The method of claim 9, wherein a ring shaped indent in the cap structure surrounds the silicon pillar, and wherein the metal cap and the at least one conducting layer both cover a center of a lower surface of the silicon pillar and are laterally confined between inner sidewalls of the ring shaped indent.

11. A method comprising:
fabricating a CMOS-MEMS structure that includes a CMOS structure and a MEMS structure, wherein the CMOS structure includes at least one CMOS device and at least one conducting layer;
fabricating a cap structure by etching a first side of a cap wafer to form one or more cavities, with an isolation layer formed on the first side of the cap wafer;
bonding the cap structure to the CMOS-MEMS structure;
etching one or more trenches at a second side of the cap wafer; and
depositing conductive material towards the second side of the cap wafer and surfaces of the one or more trenches, to form a conductive contact that passes through one of the trenches at the second side of the cap wafer and conductively connected to the at least one conducting layer of the CMOS structure.

12. The method of claim 11, further comprising:
depositing isolation material onto the second side of the cap wafer and the surfaces of the one or more trenches before depositing conductive material.

13. The method of claim 11, wherein depositing the conductive material comprises:
depositing the conductive material onto isolation material that is located on the second side of the cap wafer and on the surfaces of the one or more trenches.

14. The method of claim 11, further comprising:
depositing passivation layer on the conductive material at the second side of the cap wafer and the surfaces of the one or more trenches at the second side of the cap wafer.

15. The method of claim 11, comprising:
fabricating the CMOS structure on a first substrate; and
forming the MEMS structure at a location between the first substrate and the cap structure.

16. The method of claim 15, comprising:
forming a conducting pad on a surface of the MEMS structure that faces the isolation layer on the cap structure, with the conducting pad conductively connected to the at least one conducting layer of the CMOS structure; and
wherein the conductive contact is conductively connected to the conducting pad through the one of the trenches at the second side of the cap wafer and through an opening in the isolation layer on the first side of the cap wafer.

17. The method of claim 11, wherein both the MEMS structure and the CMOS structure are fabricated on a first substrate, and wherein the bonding the cap structure comprises:
bonding the cap structure to the CMOS-MEMS structure with hybrid bonding.

18. The method of claim 17, comprising:
conductively connecting the conductive contact with the at least one conducting layer of the CMOS structure when depositing the conductive material towards the second side of the cap wafer and the surfaces of the one or more trenches.

19. The method of claim 17, comprising:
fabricating at least one trench ring on the first side of the cap wafer to form a silicon pillar surrounded by the at least one trench ring; and
forming the isolation layer on the first side of the cap wafer and an isolation coating on an inner surface of the at least one trench ring.

20. The method of claim 19, comprising:
conductively connecting the silicon pillar with the at least one conducting layer of the CMOS structure when bonding the cap wafer to the CMOS-MEMS structure; and
conductively connecting the conductive contact with the silicon pillar when depositing the conductive material towards the second side of the cap wafer and the surfaces of the one or more trenches.

* * * * *